(12) United States Patent
Hieda et al.

(10) Patent No.: US 7,105,397 B2
(45) Date of Patent: Sep. 12, 2006

(54) SEMICONDUCTOR DEVICE AND METHOD OF FABRICATING THE SAME

(75) Inventors: Katsuhiko Hieda, Kanagawa (JP); Masahiro Kiyotoshi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 10/804,159

(22) Filed: Mar. 19, 2004

(65) Prior Publication Data

US 2005/0116300 A1  Jun. 2, 2005

(30) Foreign Application Priority Data

Nov. 28, 2003  (JP) ............................. 2003-399544

(51) Int. Cl.
*H01L 21/8238* (2006.01)
(52) U.S. Cl. .................. 438/207; 438/3; 438/240; 438/653
(58) Field of Classification Search ............ 438/3, 438/240, 653; 257/295, 310, E21.009, E21.664, 257/E27.104
See application file for complete search history.

(56) References Cited

U.S. PATENT DOCUMENTS

| 6,479,405 | B1 | 11/2002 | Lee et al. | |
| 6,706,540 | B1* | 3/2004 | Hikosaka et al. | 438/3 |
| 2003/0022522 | A1 | 1/2003 | Nishiyama et al. | |
| 2004/0072429 | A1 | 4/2004 | Hieda et al. | |

FOREIGN PATENT DOCUMENTS

| JP | 2000-114362 | 4/2000 |
| JP | 2000-183150 | 6/2000 |
| JP | 2001-308090 | 11/2001 |
| JP | 2002-203895 | 7/2002 |
| JP | 2002-367980 | 12/2002 |
| JP | 2003-31650 | 1/2003 |
| WO | WO 03/021636 | 3/2003 |

OTHER PUBLICATIONS

Sato et al., "Advanced Spin Coating Film Transfer and Hot-Pressing Process for Global Planarization with Dielectric-Material-Viscosity Control," Jpn. J. Appl. Phys. (Apr. 2002), 41:2367-73.
Jin-Hwa Heo et al., "Void Free and Low Stree Shallow Trench Isolation Technology using P-SOG for sub 0.1 µm Device". Symposium On VLSI Technology Digest of Technical Papers. pp. 132-133 (2002).
Yukio Nishiyama et al., "Method for Manufacturing Semiconductor Device", U.S. Appl. No. 10/193,143, filed Jul. 12, 2002.

* cited by examiner

*Primary Examiner*—Mai-Huong Tran
(74) *Attorney, Agent, or Firm*—Finnegan, Henderson, Farabow, Garrett & Dunner, L.L.P.

(57) ABSTRACT

According to the present invention, there is a provided a semiconductor device fabrication method having, forming a mask material in a surface portion of a semiconductor substrate, and forming a step having a projection by using the mask material; forming a dielectric film on the semiconductor substrate so as to fill the step and planarize an entire surface; annealing the dielectric film; etching back the dielectric film such that a surface of the dielectric film is positioned between upper and lower surfaces of the mask material; and removing the mask material to expose a surface of the projection of the semiconductor substrate.

8 Claims, 13 Drawing Sheets

SEMICONDUCTOR DEVICE AND METHOD OF FABRICATING THE SAME

CROSS REFERENCE TO RELATED APPLICATION

This application is based upon and claims benefit of priority under 35 USC 119 from the Japanese Patent Application No. 2003-399544, filed on Nov. 28, 2003, the entire contents of which are incorporated herein by reference.

BACKGROUND OF THE INVENTION

The present invention relates to a semiconductor device and a method of fabricating the same and, more particularly, to an STI (Shallow Trench Isolation) structure and a method of fabricating the same.

Micropatterning of semiconductor devices is more and more advancing, and an STI (Shallow Trench Isolation) structure is used for element isolation. However, as the aspect ratio of the trench width to the trench depth increases, it becomes difficult to fill the trench with the conventionally used HDP (High Density Plasma Chemical Vapor Deposition)-TEOS $SiO_2$ film. Therefore, an STI burying technique using a coating film is developed for generations in which the STI width is smaller than 100 nm.

When a coating film is used, its thickness must be increased to fill a wide STI trench.

Also, a method using a coating film of a polysilazane (to be abbreviated as PSZ hereinafter) solution is proposed.

For example, a process of curing a thick PSZ film, and planarizing the film buried in an STI trench by using CMP (Chemical Mechanical Polishing) is proposed.

If the STI width is smaller than about 70 nm, an SiN film as a mask cannot function as a stopper mask during CMP any longer. Dishing by CMP easily occurs especially in a narrow region isolated from the surrounding. This makes a good STI shape difficult to realize. In particular, it is difficult to prevent a divot and control the height of an insulating film buried in the STI trench.

FIGS. 46 to 50 illustrate the conventional fabrication method having the above problems.

As shown in a plan view of FIG. 46, active areas AA101 and AA102, an STI element isolation area STI101, and a dummy pattern DP101 are formed.

FIG. 47 is a longitudinal sectional view taken along a line A1—A1 in FIG. 46. As shown in FIG. 47, a silicon oxide film 1102 and mask silicon nitride film 1103 are formed in the surface portion of a semiconductor substrate 1101. Reactive ion etching (to be referred to as RIE hereinafter) is so performed as to leave the dummy pattern DP101 and active areas AA101 and AA102 behind, and form STI trenches in the STI element isolation area STI101.

As shown in FIG. 48, the side walls of the STI trenches are oxidized to pull back the silicon nitride film 1103.

After that, as shown in FIG. 49, a dielectric film 1106a made of PSZ is deposited on the entire surface and planarized by CMP to obtain a dielectric film 1106b.

As shown in FIG. 50, the mask silicon nitride film 1103 and pad silicon oxide film 1102 are removed, and a sacrificial silicon oxide film (not shown) is formed. In addition, this sacrificial silicon oxide film is removed, and a gate insulating film is formed.

However, the conventional fabrication method described above has the following problems.

In the above method, to form a coating film on the bottom of an STI trench having a trench width of about 4 µm, a thick PSZ film about 600 nm thick is formed by coating. As shown in FIG. 49, the coating film is thin in a wide trench and thick in a narrow trench.

Also, as shown in FIG. 48, if each side of the mask silicon nitride film 1103 is pulled back by, e.g., about 10 nm as in the formation of the conventional STI trench, the mask width of the mask silicon nitride film 1103 decreases from about 70 nm to about 50 nm.

Consequently, when CMP is performed as shown in FIG. 49, the narrow mask silicon nitride film 1103 cannot function as the CMP stopper layer any longer in some cases.

If, however, the mask silicon nitride film 1103 is not pulled back in the step shown in FIG. 48, the silicon oxide film buried in the STI trenches recedes in the step of removing the pad silicon oxide film 1102 and sacrificial silicon oxide film. Consequently, as indicated by 1151 in FIG. 50, the side walls of the STI trenches are exposed to form a so-called divot shape.

This divot shape causes a short circuit of gate electrodes when the gate electrodes are formed in the subsequent step, and decreases the yield of the products.

In the above prior art, the STI trenches are completely filled with the PSZ coating film. However, another technique of filling STI trenches halfway and then burying a silicon oxide film in these trenches is also proposed.

That is, a PSZ film in a trench having a trench width of 1 µm or more is well converted into an $SiO_2$ film in the subsequent BOX oxidation step. However, if the film thickness of this PSZ film is large, the film is not well converted into an $SiO_2$ film and forms a low-density $SiO_2$ film in a trench having a trench width of about 100 nm or less. Since the wet etching rate of the film in the trench is high, it is difficult to realize a desired STI shape by, e.g., preventing a divot and controlling the STI height.

To solve this problem, therefore, after a thin PSZ film is formed on the bottoms of STI trenches, an HDP-$SiO_2$ film is buried in the upper portions of these STI trenches to form a hybrid structure by combining the PSZ film and HDP-$SiO_2$ film.

FIGS. 51 to 55 are sectional views showing steps of filling STI trenches by the above method.

As shown in FIG. 51, a silicon oxide film 1301 and mask silicon nitride film 1302 are formed on the surface of a semiconductor substrate 1300, and RIE is so performed as to leave active areas behind and form STI trenches in an STI element isolation area. The side walls of these STI trenches are oxidized to form a silicon oxide film 1304.

As shown in FIG. 52, to form a dielectric film 1305 made of PSZ on the bottom of an STI trench having an STI trench width of, e.g., 1 µm or more, a thin PSZ film is formed by coating. In this step, as shown in FIG. 52, the coating film is thin in a wide trench and slightly thick in a narrow trench.

In particular, the coating film is formed up to the upper portion of the STI side wall surface facing the wide STI trench.

Then, as shown in FIG. 53, an $SiO_2$ film 1306a is deposited by HDP so as to cover the entire surface, thereby forming a hybrid structure. As shown in FIG. 54, planarization is performed using CMP to obtain an $SiO_2$ film 1306b.

As shown in FIG. 55, the mask silicon oxide film 1302 is removed, and wet etching is performed to expose the surface of the active area on the semiconductor substrate 1300.

In this etching step shown in FIG. 55, the wet etching rate of the PSZ coating film exposed to the surface is about twice that of the $SiO_2$ film 1306b, so a recess 1310 as indicated by the circle in FIG. 55 is formed.

The recess 1310 thus formed causes a short circuit of gate electrodes in the subsequent gate electrode formation step, and decreases the yield of the products.

As described above, SIT trenches are desirably filled such that a coating film does not exist on the STI side walls and exists only on the bottoms of these STI trenches regardless of whether the trench width is large or small. Unfortunately, no such fabrication method and structure can be realized by any prior art.

FIGS. 56 and 57 illustrate another process of filling STI trenches by using the conventional hybrid structure.

As shown in FIG. 56, a silicon oxide film 1402, floating gate conductive film 1403, and mask silicon nitride film 1404 are formed on the surface of a semiconductor substrate 1401, and RIE is so performed as to leave active areas behind and form STI trenches in an STI element isolation area.

Next, as shown in FIG. 57, the STI trenches are coated with a dielectric film 1412a made of PSZ. The coating film thickness is small in a wide trench and slightly large in a narrow trench.

After that, a dielectric film 1412b as shown in FIG. 57 is obtained by etching back the entire surface by wet etching.

However, in a portion indicated by a circle 1451 in FIG. 57, the conductive film 1403 may be exposed without being covered with the dielectric film 1412b. This sometimes causes a short circuit when gate electrodes are formed in the subsequent step, leading to a decrease in yield.

Still another conventional STI trench filling process is shown in FIGS. 58 and 59.

As shown in FIG. 58, a silicon oxide film 1502, floating gate conductive film 1503, and mask silicon nitride film 1504 are formed on the surface of a semiconductor substrate 1501, and RIE is so performed as to leave active areas behind and form STI trenches in an STI element isolation area.

Next, a TEOS-SiO$_2$ film 1511 is formed on the entire surface, and the entire surface is coated with a PSZ dielectric film 1512 so that the STI trenches are completely filled.

In the step shown in FIG. 59, the dielectric film 1512 is converted into an SiO$_2$ film 1512 by heating, the SiO$_2$ film 1512 is planarized by CMP, and the TEOS-SiO$_2$ film 1511 is etched by dry etching and wet etching.

In a portion indicated by a circle 1552 in FIG. 59, the surface of the conductive film 1503 is sometimes exposed without being covered with the TEOS-SiO$_2$ film 1511 and SiO$_2$ film 1512. This also causes a short circuit and decreases the yield.

References concerning the conventional STI trench formation methods are as follows.

Japanese Patent Laid-Open No. 2000-114362
Japanese Patent Laid-Open No. 2000-183150
Japanese Patent Laid-Open No. 2003-31650
Japanese Patent Laid-Open No. 2001-308090
Japanese Patent Laid-Open No. 2002-367980

As described above, STI trenches having different trench widths cannot be well filled by any prior art.

SUMMARY OF THE INVENTION

According to one aspect of the present invention, there is provided a semiconductor device fabrication method comprising:

forming a mask material in a surface portion of a semiconductor substrate, and forming a step having a projection by using the mask material;

forming a dielectric film on the semiconductor substrate so as to fill the step and planarize an entire surface;

annealing the dielectric film;

etching back the dielectric film such that a surface of the dielectric film is positioned between upper and lower surfaces of the mask material; and removing the mask material to expose a surface of the projection of the semiconductor substrate.

According to one aspect of the present invention, there is provided a semiconductor device fabrication method comprising:

forming island-like first and second insulating films on a semiconductor substrate;

forming a third insulating film on side surfaces of the first and second insulating films;

forming a trench in a surface portion of the semiconductor substrate by using the first, second, and third insulating films as masks;

filling the trench with a first dielectric film;

etching back the first dielectric film such that a surface of the first dielectric film is positioned between upper and bottom surfaces of the second insulating film; and exposing the surface of the semiconductor substrate by removing portions of the first and second insulating films, which are not covered with the first dielectric film.

According to one aspect of the invention, there is provided a semiconductor device comprising:

element isolation trenches formed in a surface portion of a semiconductor substrate so as to surround an island-like element formation area;

a first insulating film buried in said trenches from bottom surfaces of said trenches to a height lower than the surface of said semiconductor substrate; and a second insulating film buried on said first insulating film in said trenches, wherein said first insulating film is a polysilazane film, and said second insulating film is an HDP-SiO$_2$ film.

According to one aspect of the present invention, there is provided a semiconductor device fabrication method comprising:

forming a first insulating film on a semiconductor substrate having a step in a surface portion, thereby filling the step;

leaving the first insulating film behind on a bottom of the step by etch back;

filling the step by forming a second insulating film on a surface of the first insulating film; and annealing the first insulating film in a water-containing ambient.

According to one aspect of the present invention, there is provided a semiconductor device comprising:

element isolation trenches formed in a semiconductor substrate so as to surround an island-like element formation area;

a first insulating film formed in said trenches so as to cover inner walls of said trenches;

a second insulating film formed on said first insulating film in said trenches to a height lower than a surface of said semiconductor substrate; and a third insulating film formed on said second insulating film so as to fill said trenches.

According to one aspect of the present invention, there is provided a semiconductor device fabrication method comprising:

forming a first insulating film on a surface of a semiconductor substrate having a trench in a surface portion, thereby covering inner walls of the trench with the first insulating film;

selectively forming a second insulating film on the first insulating film in the trench; and selectively forming a third insulating film on the first and second insulating films in the trench.

According to one aspect of the present invention, there is provided a semiconductor device comprising:

a first insulating film formed on inner walls of a trench in a surface portion of a semiconductor substrate;

a second insulating film formed on said first insulating film in said trench; and a third insulating film formed on said first and second insulating films in said trench, wherein an Si density of said second insulating film surrounded by said first and third insulating films is smaller than those of said first and third insulating films.

According to one aspect of the present invention, there is provided a semiconductor device fabrication method comprising:

forming a trench in a surface portion of a semiconductor substrate;

forming a first insulating film on inner walls of the trench;

forming a second insulating film on the first insulating film;

etching back the first and second insulating films to bury the first and second insulating films in the trench to a height lower than the surface of the semiconductor substrate; and depositing a third insulating film on the first and second insulating films in the trench and planarizing the third insulating film, thereby burying the first, second, and third insulating film in the trench.

DESCRIPTION OF THE PREFERRED EMBODIMENTS

Embodiments of the present invention will be described below with reference to the accompanying drawings.

(1) First Embodiment

The first embodiment of the present invention will be described below with reference to FIGS. 1 to 8.

Figure 1:
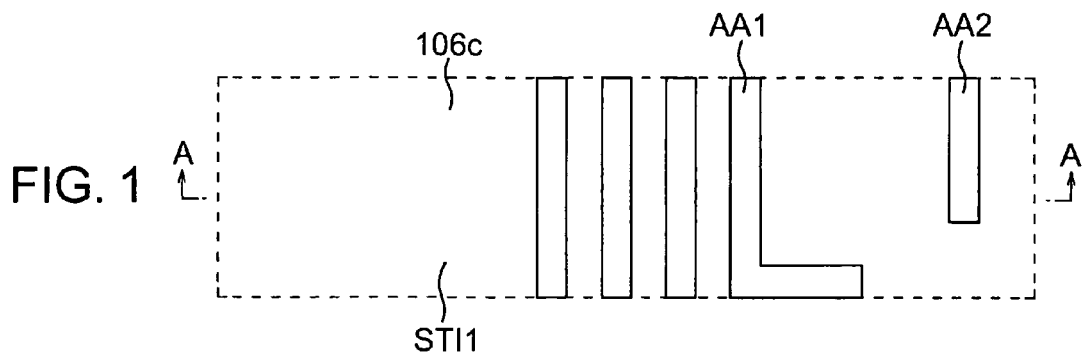
FIG. 1 is a plan view showing an outline of the arrangement of a semiconductor device to which the first to fifth embodiments of the present invention are applicable.
Figure 2:
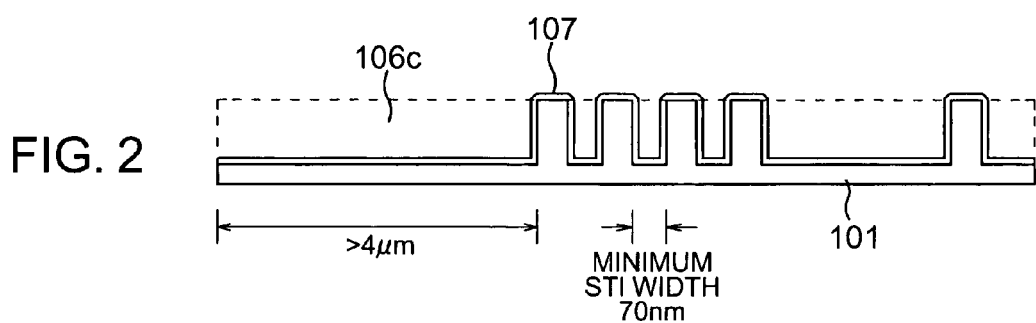
FIGS. 2 is a sectional view showing a longitudinal section taken along a line A—A in FIG. 1.

FIG. 1 shows a plan view when STI trenches of a MOS transistor having an STI element isolation structure are formed. FIG. 2 shows a sectional view taken along a line A—A in FIG. 1.

As shown in FIG. 1, active areas AA1 and AA2 are formed, and STI trenches STI1 are formed between the active areas AA1 and AA2 and filled with an insulating film 106c.

FIGS. 1 and 2, however, show none of gate electrodes, contacts, metal interconnections, and a passivation layer and the like above the wiring layers, and illustrate only the patterns of the active areas AA1 and AA2.

The STI element isolation structure according to the first embodiment is characterized by the shape of an insulating film buried in the STI trenches. This characteristic feature will be explained below with reference to FIGS. 3 to 8 each showing the section of elements in one fabrication step.

Figure 3:
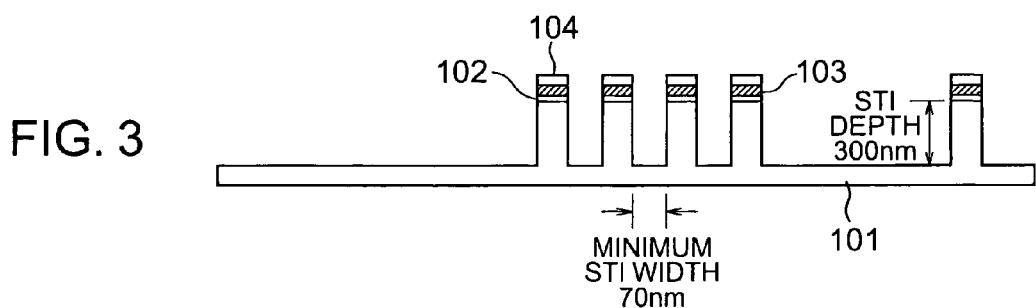
FIG. 3 is a sectional view showing the sectional structure of elements in one fabrication step according to the first embodiment of the present invention.

First, as shown in FIG. 3, a silicon oxide film (to be referred to as an $SiO_2$ film hereinafter) 102 about 4 nm thick is formed as a pad oxide film on the surface of a semiconductor substrate 101 such as a silicon substrate. On the surface of the $SiO_2$ film 102, a silicon nitride film (an $Si_3N_4$ film, to be referred to as an SiN film hereinafter) 103 about 150 nm thick is formed as a mask material by LP-CVD (Low Pressure-Chemical Vapor Deposition).

On the surface of the SiN film 103, a BSG film 104 about, e.g., 200 nm thick is formed.

After that, the BSG film 104, mask SiN film 102, and pad $SiO_2$ film 101 are patterned by the conventional exposure technique and the dry etching technique using RIE. Then, the resist film (not shown) used in the patterning is removed, and the BSG film 104 is used as a mask to form, in the semiconductor substrate 101, STI trenches about, e.g., 300 nm deep as element isolation trenches for STI element isolation.

Since these STI trenches are trenches for element isolation, trenches having various widths are formed in the surface portion of the semiconductor substrate 101. In the plan view shown in FIG. 1, the semiconductor substrate 101 has an STI trench having a large STI width of 4 μm or more, an STI trench having a small STI width of about 70 nm, an STI trench which separates the active areas AA1 and AA2 with a predetermined spacing between them, and a wide STI trench about 200 nm wide.

In this embodiment, the BSG film 104 is formed on the SiN film 103 and used as a mask when the semiconductor substrate 101 is etched. However, the semiconductor substrate 101 may also be etched by using the SiN film 103 as a mask.

Figure 4:
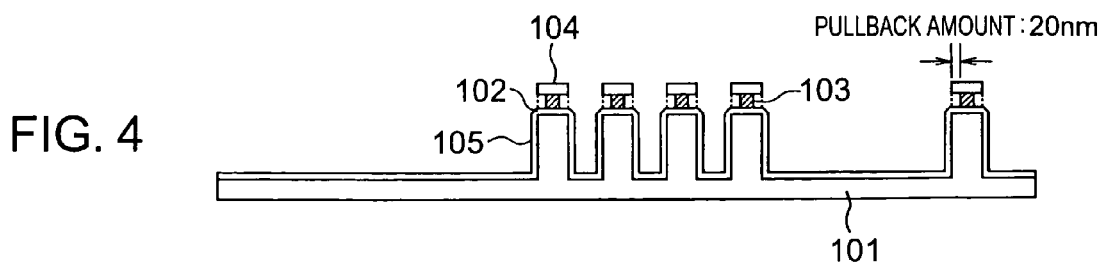
FIG. 4 is a sectional view showing the sectional structure of elements in one fabrication step according to the first embodiment of the present invention.

Next, as shown in FIG. 4, the surface of the semiconductor substrate 101 is oxidized by the conventional thermal oxidation method to form a thermal oxide film 105 about 4 nm thick on the inner walls of the STI trenches.

Note that a high-quality silicon oxide film having a uniform film thickness regardless of the surface orientation of the silicon substrate may also be formed on the side surfaces of the STI trenches by using an oxygen radical method, instead of the conventional thermal oxidation method.

Alternatively, not only the inner walls of the STI trenches but also the side surfaces of the SiN film 103 can be slightly oxidized by the ISSG (In-Situ Steam Generation) method.

Next, so-called pullback is performed to selectively pull back the SiN film 103 as a mask material by about 10 to 15 nm in the lateral direction.

Whether to use this pullback method can be determined in accordance with the required performance of the semiconductor device. In the pullback step, hot phosphoric acid or the like is generally used. In this step, it is desirable to use isotropic etching by which the selective ratio of the $SiO_2$ film 102 to the SiN film 103 is 2 or more. Since the BSG film 104 is present in this state, a reduction in amount of the SiN film 103 in the direction of film thickness can be suppressed.

Figure 5:
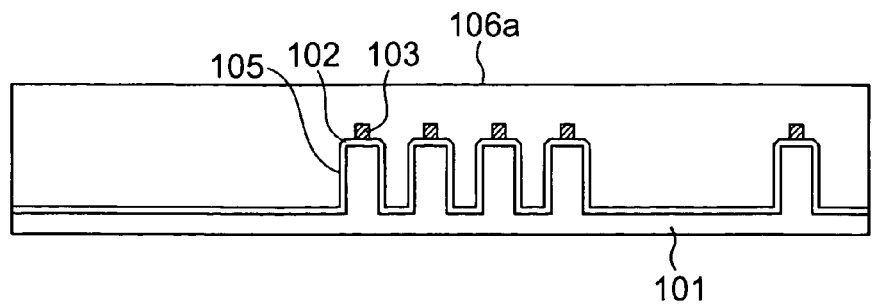
FIG. 5 is a sectional view showing the sectional structure of elements in one fabrication step according to the first embodiment of the present invention.

Subsequently, as shown in FIG. 5, the BSG film 104 is selectively removed, and a dielectric film 106a is buried flat in the STI trenches.

In this embodiment, the STP (Spin Coating Film Transfer and Hot-Pressing) method will be described below as the method of burying the dielectric film. This STP method is described in the following reference.

Japanese Journal of Applied Physics, Vol. 41, No. 4B, pp. 2367–2373 (2002).

Figure 24:
FIG. 24 is a sectional view showing a step of a method of burying an insulating film in STI trenches by using the STP method.

In the STP method, as shown in FIG. 24, a dielectric film 202 made of, e.g., PSZ is first formed on a base film 201.

Figure 25:
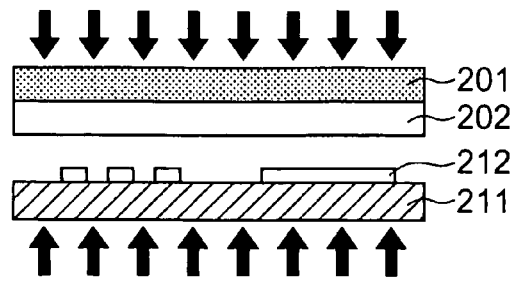
FIG. 25 is a sectional view showing a step of a method of burying an insulating film in STI trenches by using the STP method.

Then, as shown in FIG. 25, the base film 201 is pressed under heating against the surface of a semiconductor substrate 211 having steps 212, such that the dielectric film 202 faces down.

Figure 26:
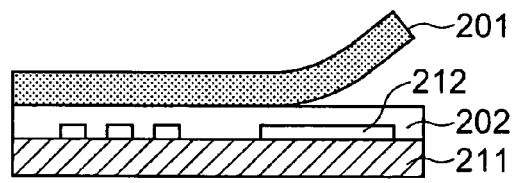
FIG. 26 is a sectional view showing a step of a method of burying an insulating film in STI trenches by using the STP method.
Figure 27:
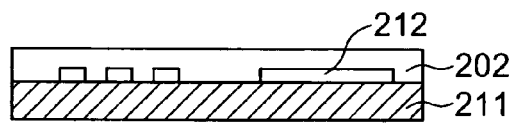
FIG. 27 is a sectional view showing a step of a method of burying an insulating film in STI trenches by using the STP method.

After that, the base film 201 is removed off as shown in FIG. 26 to obtain the dielectric film 202 buried flat on the steps 212 as shown in FIG. 27.

The thickness of the dielectric film 202 on the steps 212 can be controlled to a certain degree by the thickness of the dielectric film 202 formed on the base film 201 and the pressure during adhesion.

For example, in FIG. 5, the dielectric film, i.e., the PSZ film 106a is deposited on the $SiO_2$ film 102 so as to have a film thickness of about 100 nm by using the STP method.

In a coating apparatus for coating the base film, a baking step of volatilizing a solvent at about 150° C. is performed for about 3 min.

In this step, since the SiN film 103 is about 150 nm thick, the thickness from the surface of the PSZ film 106a to the bottom of each STI trench is about 550 nm.

The burying characteristics of the STP method are so good that the dielectric film can be buried with a flatness of about ±10 nm over the entire surface without any voids in both a narrow STI trench having a trench width of about 70 nm and a wide STI trench.

Then, the PSZ film 106a is converted into an $SiO_2$ film 106b. This step can be explained by

$$SiH_2NH+2O \rightarrow SiO_2+NH_3 \qquad (1)$$

That is, the PSZ film 106a reacts with oxygen (O) generated by the decomposition of steam ($H_2O+O_2$) and changes into $SiO_2$ and $NH_3$ (ammonia gas), thereby forming the $SiO_2$ film 106b.

Since the central portion of the element formation area is covered with the SiN film 103, the surface of the semiconductor substrate 101 does not oxidize in this element formation area central portion. However, an oxide film is sometimes formed in the peripheral portion of the element formation area from which the SiN film 103 has receded by pullback, depending on the temperature or the ambient conditions.

This chemical reaction proceeds from the surface of the PSZ film 106a. For example, the PSZ film 106b about 600 nm thick formed on the semiconductor substrate 101 can be converted into an $SiO_2$ film by performing oxidation (e.g., burning oxidation (to be referred to as BOX oxidation hereinafter)) in a steam ambient at 400° C. for about 15 to 30 min.

Accordingly, when BOX oxidation is performed in a steam ambient at 400° C. for about 15 min, the conversion from Si—N bonds to Si—O bonds is promoted because the thickness of the PSZ film 106a from the surface to the bottom of each STI trench is about 550 nm. As a consequence, the PSZ film 106a buried in the STI trenches having different trench widths can be completely converted into the $SiO_2$ film 106b down to the bottoms of these trenches.

Although BOX oxidation at 400° C. is used in this embodiment, the temperature of oxidation in a steam ambient can be selected from the range of about 200° C. to 600° C. in accordance with the allowable oxide film formation limit. A desirable oxidation temperature is presumably 300° C. to 400° C.

Subsequently, annealing is performed for about 30 min in an oxidizing ambient or an inert gas ambient such as a nitrogen ambient at 700° C. to 1,000° C., preferably, in a nitrogen ambient at about 850° C. This releases $NH_3$ and $H_2O$ remaining in the $SiO_2$ film 106b converted from the PSZ film 106a, thereby densifying the $SiO_2$ film 106b. The leakage current of the film can be reduced by this conversion into an $SiO_2$ film having a high Si density.

Also, when annealing is performed in an inert gas ambient such as a nitrogen gas ambient, oxidation of the silicon side surfaces of the STI trenches can be prevented. Accordingly, a decrease in element width, i.e., an increase in STI width can be suppressed.

In an oxidizing ambient, the concentration of an impurity such as carbon (C) in the film can be further reduced. This makes it possible to reduce the leakage current and also reduce the fixed electric charge in the interface between the film and semiconductor substrate. However, caution should be exercised on the formation of an oxide film.

In this step, the central portion of the element formation area is covered with the SiN film 103, so this portion does not oxidize even in an oxidizing ambient.

In the densify step, RTA (Rapid Thermal Annealing or RTO (Rapid Thermal Oxidation) may also be used instead of annealing by a common furnace.

When RTA is used, a high-temperature annealing step can be performed at a high temperature, e.g., 950° C. for a short time period of about 20 sec.

Any of these annealing steps may also be performed after the following etch back step. Also, the film stress of the $SiO_2$ film 106b can be reduced by the settings in these heating steps.

Figure 6:
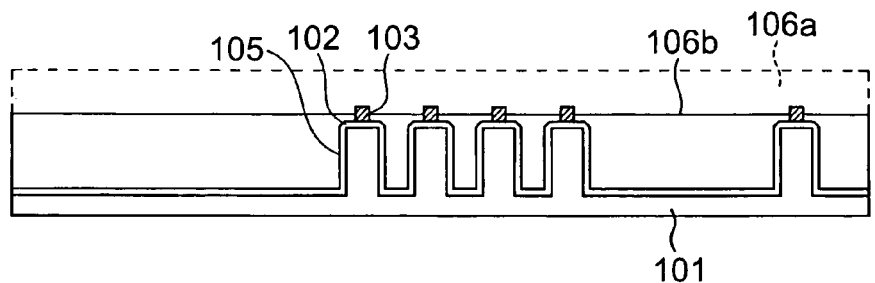
FIG. 6 is a sectional view showing the sectional structure of elements in one fabrication step according to the first embodiment of the present invention.

As shown in FIG. 6, to adjust the height of the STI trenches, the $SiO_2$ film 106b is etched back by, e.g., dry etching or wet etching. Especially when dry etching is used, an etching signal indicating whether the surface of the SiN film 103 is exposed is monitored, and the $SiO_2$ film 106b is formed such that the height from the surface of the semiconductor substrate 101 is about, e.g., 20 nm.

When etch back is performed by dry etching, no large difference between the etching rates appears due to the variation in Si density of the $SiO_2$ film 106b caused by the density difference between the STI patterns of the PSZ film 106a, i.e., the difference between the STI widths. Therefore, an $SiO_2$ film 106b having a film thickness substantially corresponding to the uniformity of etch back can be formed in the STI trenches and on the side surfaces of the SiN film 103a.

In this embodiment, the film thickness of the $SiO_2$ film 106b from the surface of the semiconductor substrate 101 is 20 nm. However, this value can be adjusted by a process performed after that.

By the steps up to this point, the $SiO_2$ film 106b is formed substantially flat on the semiconductor substrate 101 without using any planarization process such as CMP.

This is so because the nonuse of CMP eliminates the nonuniformity of the STI patterns upon planarization caused by the reduction in amount of the SiN film 103 as an etch back stopper.

Figure 7:
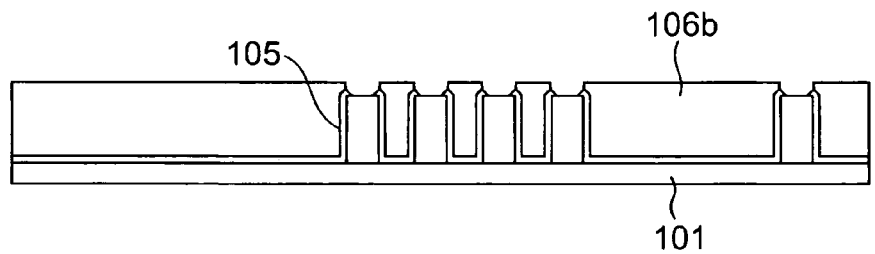
FIG. 7 is a sectional view showing the sectional structure of elements in one fabrication step according to the first embodiment of the present invention.

Next, as shown in FIG. 7, the SiN film 103 and pad $SiO_2$ film 102 are removed to expose the surface of the semiconductor substrate 101.

In this step, it is desirable to use a wet etching solution with which the etching rates of the pad $SiO_2$ film 102 and the $SiO_2$ film 106b buried in the STI trenches are as equal as possible.

For example, when buffered fluoric acid (buffered HF) is used, the wet etching rate of the $SiO_2$ film 106b can be decreased to about 1.4 times that of a thermal oxide film.

This can also prevent excess etching of the $SiO_2$ film 106b on the STI trenches when the pad $SiO_2$ film 102 is removed.

Figure 8:
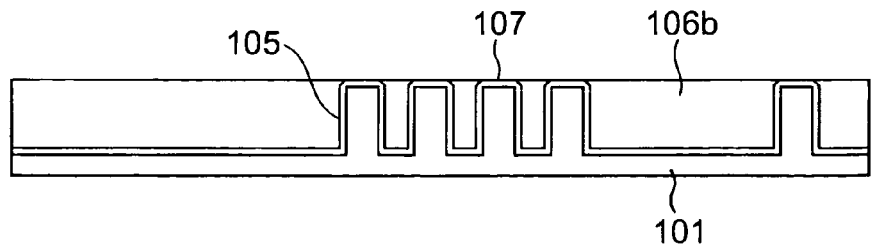
FIG. 8 is a sectional view showing the sectional structure of elements in one fabrication step according to the first embodiment of the present invention.

In a step shown in FIG. 8, the formation of a sacrificial oxide film 107, channel ion injection, the removal of the sacrificial oxide film, and the formation of a gate insulating film are performed.

In this stage, the STI height and pullback amount are optimized so that the $SiO_2$ film 106b buried in the STI trenches is substantially even with respect to the surface of the semiconductor substrate 101.

After that, although not shown, a MOS transistor is completed through, e.g., the formation of gate electrodes, source/drain diffusion layers, dielectric interlayers, contacts, wiring layers, a passivation film, and pads.

In the fabrication method according to the first embodiment described above, a semiconductor device, particularly, a high-aspect-ratio STI structure having a good shape can be formed without any shape deterioration such as a recess, by forming a dielectric film by the STP method.

In particular, a PSZ film having a desired film thickness can be uniformly formed over the entire wafer surface regardless of whether the STI width is as large as 1 μm or more or as small as about 70 nm or less. Accordingly, even in a device having STI trenches different in STI trench width, a dielectric film can be buried in these STI trenches without any shape deterioration. This implements a high-yield element isolation structure.

Also, even in the semiconductor substrate surface oxidation step and oxide film removal step repeated in the semiconductor fabrication process after the STI formation, element isolation can be realized by maintaining the well-shaped STI structure. Furthermore, since the leakage current and the fixed electric charge on the bottom of each STI trench can be reduced, the yield of the products can be increased.

Second Embodiment

The STI structure of a semiconductor device and a method of fabricating this semiconductor device according to the second embodiment of the present invention will be described below.

Figure 9:
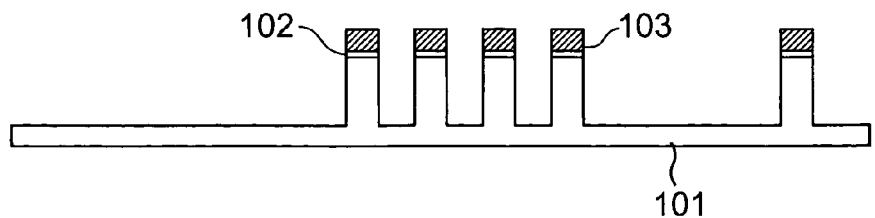
FIG. 9 is a sectional view showing the sectional structure of elements in one fabrication step according to the second embodiment of the present invention.
Figure 10:
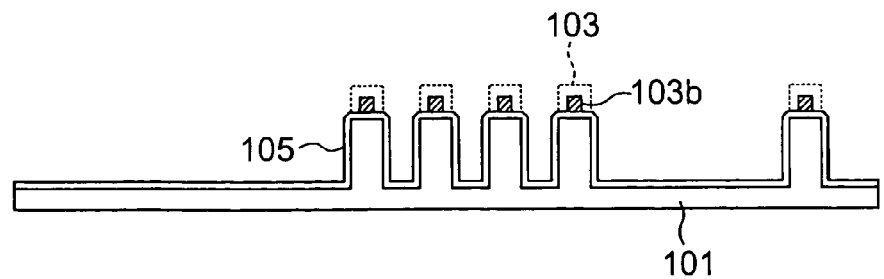
FIG. 10 is a sectional view showing the sectional structure of elements in one fabrication step according to the second embodiment of the present invention.

FIGS. 9 and 10 illustrate the sectional structure of the STI structure according to the second embodiment in order of steps.

The steps of this embodiment are the same as the first embodiment described above except for the step of pulling back a mask SiN layer 103. Accordingly, only this step different from the first embodiment will be explained below.

In this embodiment, as shown in FIG. 9, a semiconductor substrate 101 is etched by using an $SiO_2$ film 102 and the SiN film 103 as portions of a mask layer. In the pullback step performed after that, as shown in FIG. 10, the SiN film 103 is etched by a desired amount, e.g., about 20 nm, by using hot phosphoric acid.

In this manner, a pullback shape similar to that of the first embodiment shown in FIG. 4 can be obtained. Although the film thickness of an SiN film 103b reduces, the formation of the mask material 104 in the first embodiment can be omitted. This simplifies the fabrication process.

Third Embodiment

The STI structure of a semiconductor device and a method of fabricating this structure according to the third embodiment of the present invention will be described below.

Figure 11:
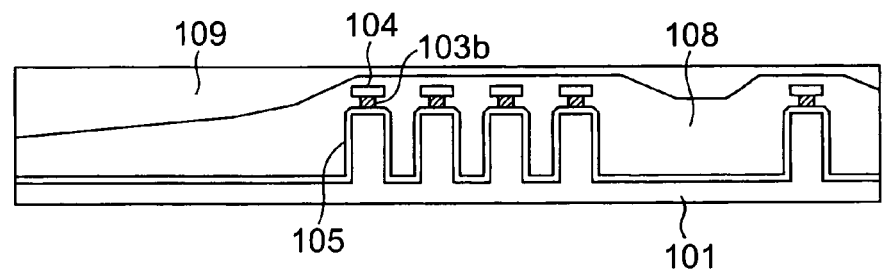
FIG. 11 is a sectional view showing the sectional structure of elements in one fabrication step according to the third embodiment of the present invention.

FIG. 11 shows the STI structure according to the third embodiment. The steps of this embodiment are the same as the first embodiment except for the process of forming an insulating film for the first time on a semiconductor substrate. Accordingly, only the steps different from the first embodiment will be explained below.

In the first embodiment shown in FIG. 5, a dielectric film 106a made of PSZ is formed by using the STP method. In this embodiment, as shown in FIG. 11, a dielectric film 108 made of PSZ is formed as the first dielectric film on a semiconductor substrate 101 by performing the conventional spin coating method a plurality of number of times, without using the STP method.

For example, a coating film 108 made of PSZ is first formed on the entire surface, and fine patterns of lines/spaces, e.g., patterns of about 100 nm/100 nm or less are buried.

Subsequently, the second coating is performed on the entire surface so as to fill wide STI trenches in which the film thickness of the coating film 108 is small. A dielectric film 109 made of PSZ is then buried to planarize the whole surface.

The second coating may also be performed after an oxidation process which is performed after the first coating. Also, the entire wafer surface can be made even after a plurality of times of coating by adjusting the molecular weight and viscosity of each of the PSZ dielectric films 108 and 109, or by adjusting the rotational speed of spin coating in accordance with the number of times of coating.

After that, annealing is performed at a temperature of about 400° C. in a steam-containing ambient for about 30 min.

In addition, a densify step is performed at about 850° C. to complete the process of burying the dielectric films in the STI trenches. The rest is the same as the first embodiment, so a detailed description thereof will be omitted.

In this embodiment, the PSZ dielectric films 108 and 109 can be made flat on the semiconductor substrate surface without using the STP method.

Fourth Embodiment

The STI structure of a semiconductor device and a method of fabricating this structure according to the fourth embodiment of the present invention will be described below.

FIGS. 12 to 16 illustrate the formation of the STI structure according to the fourth embodiment in order of steps.

The steps of this embodiment are the same as the first embodiment except that before a dielectric film made of PSZ is formed on a semiconductor substrate, another insulating film is formed. Accordingly, only the steps different from the first embodiment will be explained below.

This embodiment uses a so-called pullback method by which an SiN film as a mask member is selectively pulled back by about 20 nm in the lateral direction. However, it is not always necessary to use this pullback method, so a method can be selected in accordance with the required performance of the semiconductor device.

In the pullback step, hot phosphoric acid or the like is generally used. In this step, it is desirable to use isotropic etching by which the selective ratio of an $SiO_2$ film 102 to an SiN film 103 is 2 or more.

Figure 12:
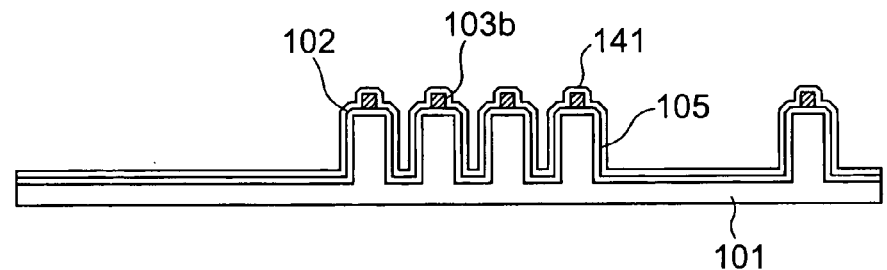
FIG. 12 is a sectional view showing the sectional structure of elements in one fabrication step according to the fourth embodiment of the present invention.

As shown in FIG. 12, after the SiN film 103 is pulled back to form an SiN film 103b, a high-coverage insulating film 141 having a film thickness so adjusted as not to completely fill STI trenches is formed on the entire surface. In this embodiment, a TEOS-$SiO_2$ film 141 is formed by LP-CVD.

The film thickness of the $SiO_2$ film 141 is set at about 10 to 20 nm so as not to completely fill an STI trench having a width of, e.g., 70 nm.

After that, densify annealing of the TEOS-$SiO_2$ film 141 is performed in, e.g., a nitrogen ambient at about 800° C. for about 30 min.

This densify process improves the film quality of the TEOS-$SiO_2$ film 141, and makes its wet etching rate equal to that of a thermal oxide film in the later step.

Figure 13:
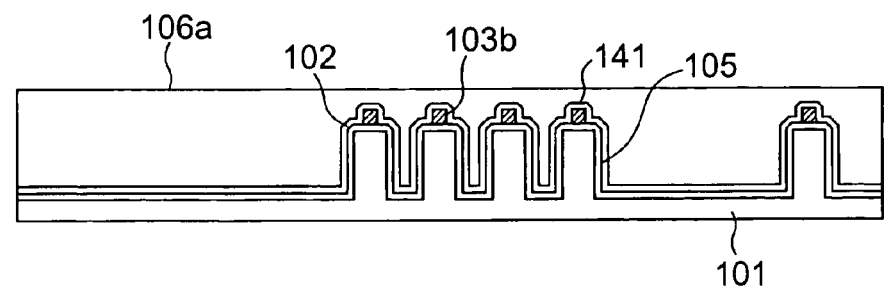
FIG. 13 is a sectional view showing the sectional structure of elements in one fabrication step according to the fourth embodiment of the present invention.

Next, as shown in FIG. 13, as an insulating film formed on the $SiO_2$ film 141, a coating type dielectric film 106a made of PSZ is formed on the entire surface.

Although the STP method is used in this embodiment, it is also possible to use another method, e.g., perform spin coating a plurality of number of times.

The dielectric film 106a is then annealed at a temperature of about 400° C. in a steam-containing ambient for about 30 min.

In this stage, the PSZ dielectric film 106a is not completely converted into an $SiO_2$ film in many cases.

Figure 14:
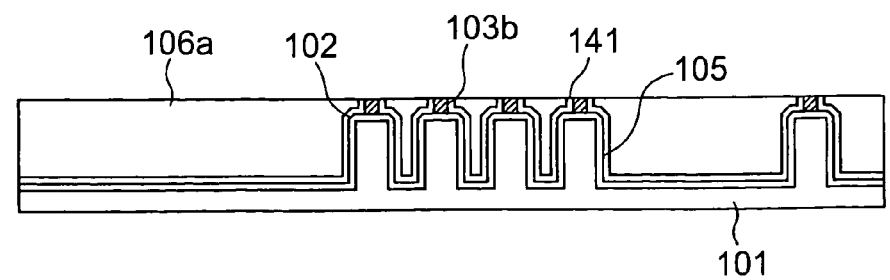
FIG. 14 is a sectional view showing the sectional structure of elements in one fabrication step according to the fourth embodiment of the present invention.

Subsequently, as shown in FIG. 14, in order to leave the TEOS-$SiO_2$ film 141 and PSZ dielectric film 106a behind in the STI trenches and remove the rest, the PSZ dielectric film 106a is etched back by dry etching or wet etching using BHF or the like so as to have a height of about 20 nm from the surface of the semiconductor substrate 101 such that the side surfaces of the SiN film 103b are exposed.

Figure 15:
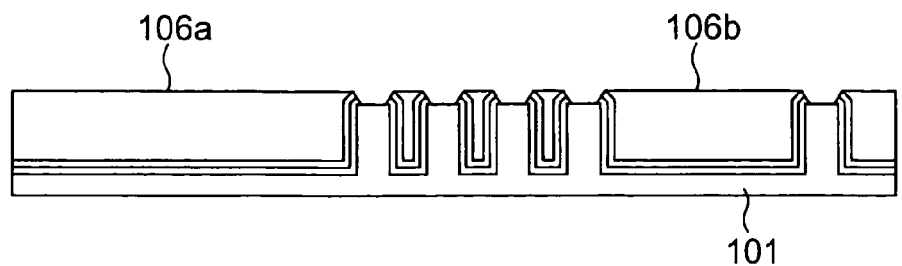
FIG. 15 is a sectional view showing the sectional structure of elements in one fabrication step according to the fourth embodiment of the present invention.

As shown in FIG. 15, the PSZ dielectric film 106a is converted into an $SiO_2$ film 106b by performing annealing in an oxygen ambient or an inert gas ambient such as a nitrogen ambient at a temperature of 700° C. to 1,000° C., e.g., about 850° C. for about 30 min.

This annealing densifies the $SiO_2$ film 106b by releasing $NH_3$ or $H_2O$ remaining in the film. The leakage current of the film can be reduced by this conversion into an $SiO_2$ film having a high Si density.

Also, in an oxygen ambient, the concentration of an impurity such as carbon (C) in the film can be further reduced. This makes it possible to reduce the leakage current and also reduce the fixed electric charge in the interface between the film and semiconductor substrate. Since the $SiO_2$ film 106b is a thin film, the efficiency of this annealing is high.

Then, the SiN film 103b and pad $SiO_2$ film 102 are removed to expose the surface of the semiconductor substrate 101.

In this step, it is desirable to use a wet etching solution with which the etching rates of the thermal oxide film 102 and the $SiO_2$ film 106b buried in the STI trenches are as equal as possible. For example, when buffered fluoric acid (buffered HF) is used, the wet etching rate of the $SiO_2$ film 106b can be decreased to about 1.4 times that of the thermal oxide film. This can also prevent excess etching of the $SiO_2$ film 106b on the STI trenches when the pad $SiO_2$ film 102 is removed.

In this embodiment, the side surfaces of the $SiO_2$ film 106b are covered with the TEOS-$SiO_2$ film 141. Compared to the first embodiment described earlier, therefore, recession of the $SiO_2$ film 106b from the surface of the semiconductor substrate 101 can be prevented.

Figure 16:
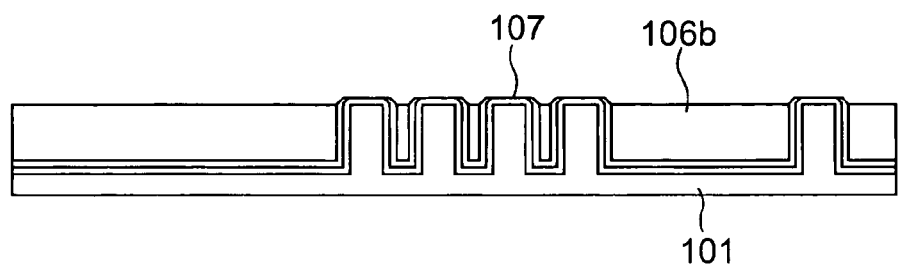
FIG. 16 is a sectional view showing the sectional structure of elements in one fabrication step according to the fourth embodiment of the present invention.

Subsequently, in a step shown in FIG. 16, the formation of a sacrificial oxide film 107, channel ion injection, the removal of the sacrificial oxide film, and the formation of a gate insulating film are performed.

In this stage, the $SiO_2$ film 106b buried in the STI trenches is substantially leveled with or slightly lower than the surface of the semiconductor substrate 101, but the corners of the STI trenches are covered with the TEOS-$SiO_2$ film 141.

After that, a MOS transistor is completed through, e.g., the formation of gate electrodes, source/drain diffusion layers, dielectric interlayers, contacts, wiring layers, a passivation film, and pads.

In the fourth embodiment described above, a semiconductor device, particularly, a high-aspect-ratio STI structure can be realized without any shape deterioration such as a recess, by forming a dielectric film made of PSZ by the STP method.

In particular, a PSZ film can be uniformly formed with a desired film thickness on the entire wafer surface regardless of whether the STI width is as large as 1 μm or more or as small as about 70 nm or less.

Accordingly, it is possible to implement an element isolation structure having no shape deterioration in STI trenches regardless of the STI trench width.

Also, even in the semiconductor substrate surface oxidation step and oxide film removal step repeated in the semiconductor fabrication process after the STI trench formation, element isolation can be done by maintaining the well-shaped STI structure capable of preventing exposure of the STI corners. Furthermore, since the leakage current and the fixed electric charge on the bottom of each STI trench can be reduced, the yield of the products can be increased.

Fifth Embodiment

The STI structure of a semiconductor device and a method of fabricating this structure according to the fifth embodiment of the present invention will be described below.

FIG. 17 to 23 illustrate the formation of the STI structure according to the fifth embodiment in order of steps.

The steps of this embodiment are the same as the first embodiment except for an STI trench formation method and the formation of a CVD oxide film on the side walls of an SiN film. Accordingly, only the steps different from the first embodiment will be explained below.

Also, this embodiment does not use the pullback method by which an SiN film as a mask member is selectively pulled back by about 20 nm in the lateral direction. However, the embodiment achieves the same effects as when the pullback method is used.

Figure 17:
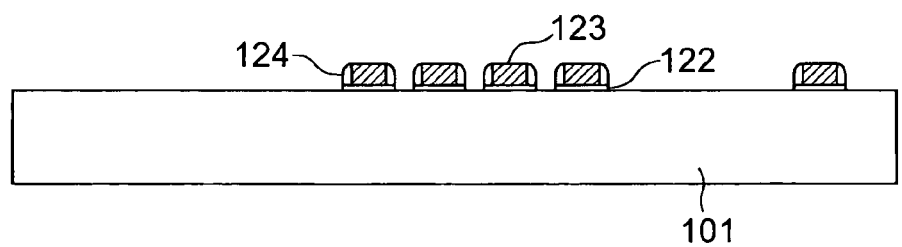
FIG. 17 is a sectional view showing the sectional structure of elements in one fabrication step according to the fifth embodiment of the present invention.

First, as shown in FIG. 17, an $SiO_2$ film 122 about, e.g., 4 nm thick is formed as a pad oxide film on the surface of a semiconductor substrate 101. On the surface of the $SiO_2$ film 122, an SiN film 123 about 150 nm thick is formed as a mask material by LP-CVD.

After that, the SiN film 123 is processed by the conventional exposure technique and the dry etching technique using RIE. Then, the resist film (not shown) is removed, and a TEOS-$SiO_2$ film 124 about, 20 nm thick is deposited on the entire surface by LP-CVD.

Dry etch back is performed on the entire surface of the $SiO_2$ film 124 by using RIE, thereby leaving the $SiO_2$ film 124 behind on the side walls of the SiN film 123. This step is equivalent to a so-called "sidewall leaving" step.

Figure 18:
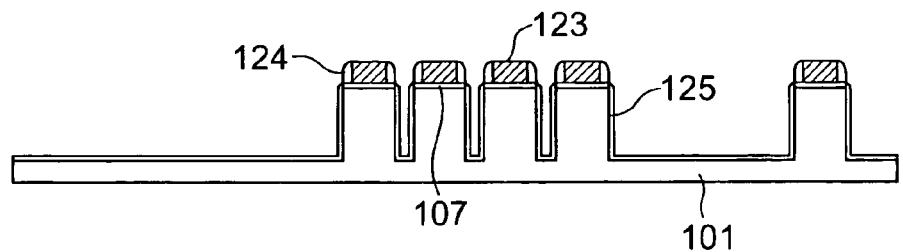
FIG. 18 is a sectional view showing the sectional structure of elements in one fabrication step according to the fifth embodiment of the present invention.

As shown in FIG. 18, the SiN film 123 and $SiO_2$ film 124 are used as masks to form, in the semiconductor substrate 101, STI trenches about, e.g., 200 to 300 nm deep for STI element isolation. Since these trenches are element isolation trenches, STI trenches having different widths are formed as needed. In this embodiment, it is assumed that a wide STI trench 4 μm wide or more, a narrow STI trench about 70 nm, and an STI trench about 200 nm are formed.

The semiconductor substrate 101 is oxidized by the conventional thermal oxidation method to form a thermal oxide film 125 about 2 to 4 nm thick on the inner walls of the STI trenches.

Note that a high-quality silicon oxide film having a uniform film thickness regardless of the surface orientation of the silicon substrate 101 may also be formed on the side surfaces of the STI trenches by using oxygen radicals, instead of the conventional thermal oxidation.

Alternatively, not only the inner walls of the STI trenches but also the side surfaces of the SiN film 123 can be slightly oxidized by the ISSG (In-Situ Steam Generation) method.

Figure 19:
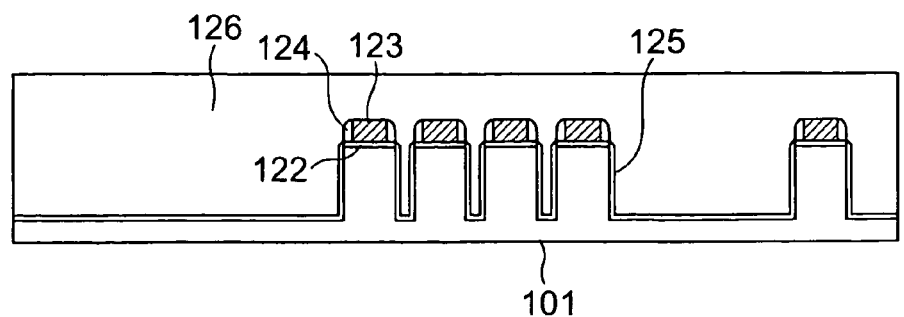
FIG. 19 is a sectional view showing the sectional structure of elements in one fabrication step according to the fifth embodiment of the present invention.

Next, as shown in FIG. 19, a dielectric film 126 is buried in the entire surface including the STI trenches so as to be flat along the surface of the semiconductor substrate 101. In this embodiment, the STP method will be described below as the method of burying the dielectric film. However, the dielectric film 126 may also be buried by using another planarization method.

The dielectric film 126 is buried by using the STP method so as to have a film thickness of about 100 nm on the SiN film 123. In this embodiment, a PSZ film, for example, is deposited.

In this STP process, a baking step of volatilizing a solvent at about 150° C. is performed for about 3 min by using a coating apparatus for coating the base film.

Since the SiN film 123 is about 130 nm thick, the film thickness from the surface of the dielectric film 126 to the bottom of each STI trench is about 534 nm.

The burying characteristics of the STP method are good as mentioned earlier so that the dielectric film can be buried with a flatness of about ±10 nm over the entire surface without any voids in both a narrow STI trench having a trench width of about 70 nm and a wide STI trench.

Then, the dielectric film 126 is converted into an $SiO_2$ film by performing BOX oxidation in a steam ambient at, e.g., 400° C. for about 15 to 30 min.

Although BOX oxidation at 400° C. is used in this embodiment, the temperature of oxidation in a steam ambient can be selected from the range of about 200° C. to 600° C. in accordance with the allowable oxide film formation limit. Desirably, the oxidation temperature is 350° C. to 450° C.

Subsequently, annealing is performed for about 30 min in an oxidizing ambient or an inert gas ambient such as a nitrogen ambient at 700° C. to 1,000° C., preferably, in a nitrogen ambient at about 850° C. This releases $NH_3$ and $H_2O$ remaining in an $SiO_2$ film converted from the PSZ film, thereby densifying the $SiO_2$ film. As a consequence, the film is converted into an $SiO_2$ film having a high Si density.

Any of these annealing steps may also be performed after the following etch back step. Also, the film stress of the $SiO_2$ film 126 can be changed by the settings in these heating steps.

Figure 20:
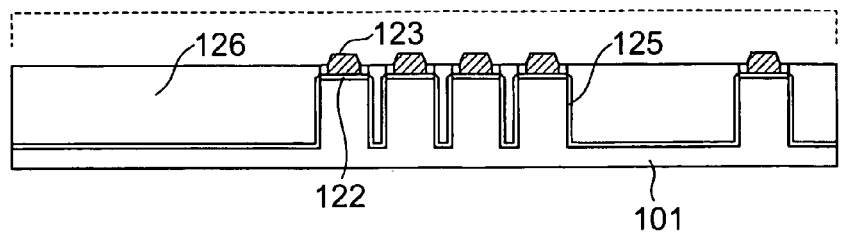
FIG. 20 is a sectional view showing the sectional structure of elements in one fabrication step according to the fifth embodiment of the present invention.

Next, as shown in FIG. 20, to adjust the height of the STI trenches, the $SiO_2$ film 126 is etched back by, e.g., dry etching using the RIE method. In this step, an etching signal indicating whether the surface of the SiN film 123 is exposed is monitored, and the $SiO_2$ film 126 is processed such that the height from the surface of the semiconductor substrate 101 is about, e.g., 20 nm.

When etch back is performed by dry etching, no large difference between the etching rates appears due to the variation in Si density of the $SiO_2$ film 126 caused by the density difference between the STI patterns, i.e., the difference between the STI widths. Therefore, an $SiO_2$ film 126 having a film thickness substantially corresponding to the uniformity of etch back can be formed in the STI trenches and on the side surfaces of the SiN film 123.

In this embodiment, the film thickness of the $SiO_2$ film 126 from the surface of the semiconductor substrate 101 is 20 nm. However, this value can be adjusted by a process performed after that.

Figure 21:
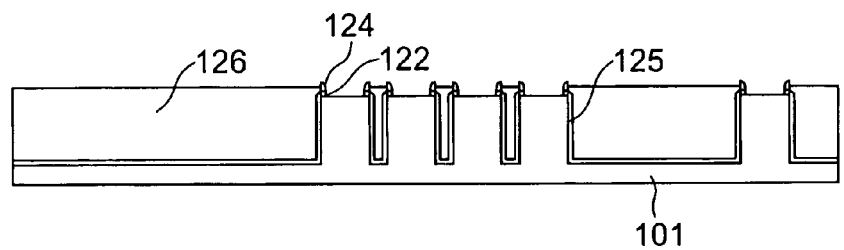
FIG. 21 is a sectional view showing the sectional structure of elements in one fabrication step according to the fifth embodiment of the present invention.

As shown in FIG. 21, the SiN film 123 and the pad $SiO_2$ film 122 below the SiN film 123 are removed to expose the surface of the semiconductor substrate 101.

In this step, it is desirable to use a wet etching solution with which the etching rates of the thermal oxide film 122 and the $SiO_2$ film 126 buried in the STI trenches are as equal as possible. For example, when buffered fluoric acid (buffered HF) is used, the wet etching rate of the $SiO_2$ film 126 can be decreased to about 1.4 times that of the thermal oxide film.

This can also prevent excess etching of the $SiO_2$ film 126 on the STI trenches when the pad $SiO_2$ film 122 is removed.

During this wet etching, it is desirable to perform accurate etching film thickness control so that no excess over etching is performed.

In this manner, as shown in FIG. 21, the SiO$_2$ film 124 can be left behind on the side surfaces of the SiO$_2$ film 126 even though the surface of the semiconductor substrate 101 is exposed.

Figure 22:
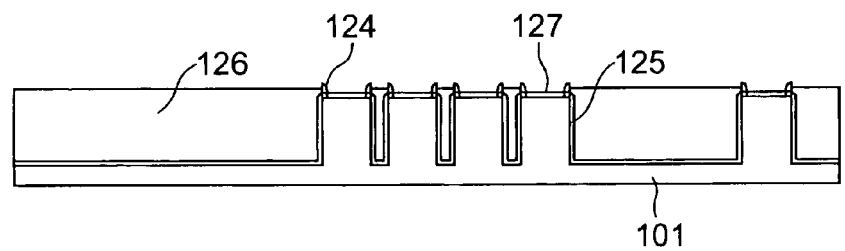
FIG. 22 is a sectional view showing the sectional structure of elements in one fabrication step according to the fifth embodiment of the present invention.

Subsequently, as shown in FIG. 22, a sacrificial oxide film 127 is formed, and channel ion injection (not shown) is performed.

Figure 23:
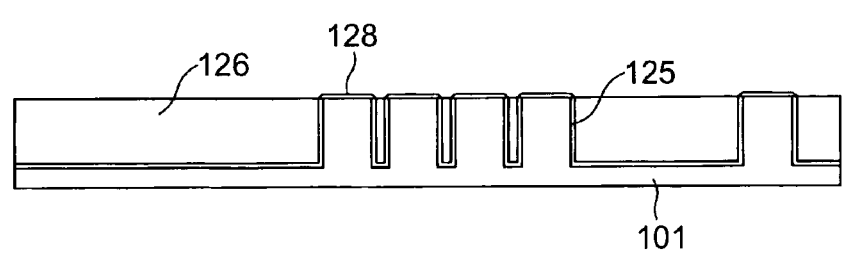
FIG. 23 is a sectional view showing the sectional structure of elements in one fabrication step according to the fifth embodiment of the present invention.

Furthermore, as shown in FIG. 23, the sacrificial oxide film 127 is removed, and a gate insulating film 128 is formed.

In this stage, the wet etching amount is desirably so adjusted that the SiO$_2$ film 126 buried in the STI trenches is substantially leveled with the surface of the semiconductor substrate 101.

After that, a MOS transistor is completed through, e.g., the formation of gate electrodes, source/drain diffusion layers, dielectric interlayers, contacts, wiring layers, a passivation film, and pads.

In the fabrication method according to the fifth embodiment described above, particularly a dielectric film is formed by the STP method, a high-aspect-ratio STI structure having a desired shape can be formed without any shape deterioration such as a recess.

In particular, a dielectric film having a desired film thickness can be uniformly formed over the entire wafer surface regardless of whether the STI width is as large as 1 µm or more or as small as about 70 nm or less.

Accordingly, an element isolation structure having no shape deterioration in STI trenches can be realized regardless of the STI trench width.

Also, even in the semiconductor substrate surface oxidation step and oxide film removal step repeated in the semiconductor fabrication process after the STI formation, element isolation can be realized by maintaining the well-shaped STI structure having no exposed STI corners. In addition, since the leakage current and the fixed electric charge on the bottom of each STI trench can be reduced, the yield of the products can be increased.

Furthermore, STI having a width smaller than the lithography limit can be realized, and the active area width can be increased. Therefore, the channel width of the transistor can be increased, and as a consequence the channel current can be increased. This makes it possible to increase the driving current and thereby increase the operation speed of the element.

As described above, the first to fifth embodiments of the present invention achieve the following effects.

First, even when the STI width is as small as 70 nm or less, no damage is given to the mask silicon nitride film during etching by CMP, and the formation of a recess by wet etching is prevented when the pad silicon oxide film or sacrificial silicon oxide film is removed.

Accordingly, no acute silicon corners are exposed to the upper side surfaces of the STI trench. This can realize an element isolation structure having no recess, called a divot, formed by recession of the buried insulating film.

In addition, a material such as a PSZ film having a small film stress is formed in both wide and narrow STI trenches. This makes it possible to alleviate the film stress of the buried film in these STI trenches and reduce the pattern dependence of silicon crystal defects, and helps increase the yield of the products.

Sixth Embodiment

The sixth embodiment of the present invention will be described below with reference to the accompanying drawings.

Figure 28:
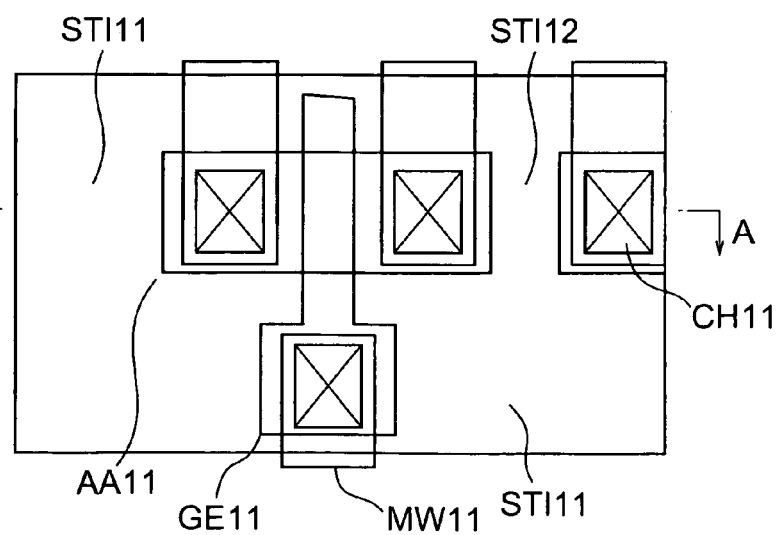
FIG. 28 is a plan view showing an outline of the arrangement of a semiconductor device to which the sixth to eighth embodiments of the present invention are applicable.
Figure 29:
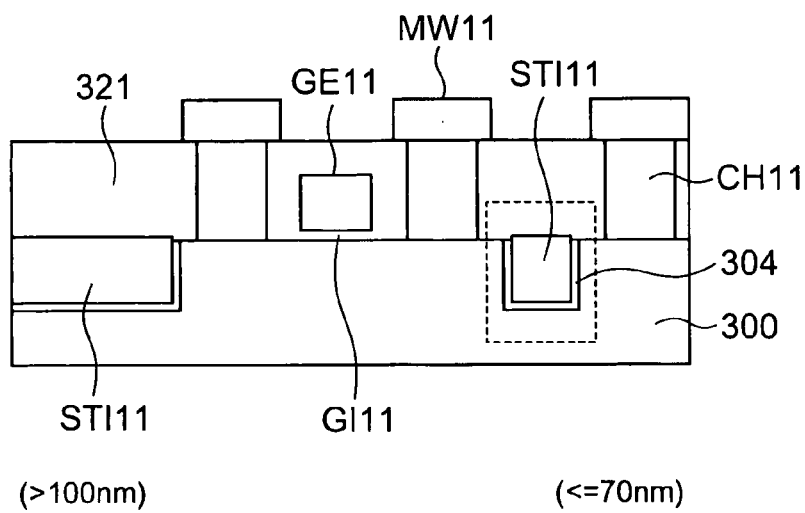
FIG. 29 is a sectional view showing a longitudinal section taken along a line A—A in FIG. 29.

FIG. 28 is a plan view of a MOS transistor structure using an STI element isolation structure. FIG. 29 shows a longitudinal section taken along a line A—A in FIG. 28. Note that wiring layers and a passivation layer above metal interconnections are omitted from these drawings.

In the surface portion of a semiconductor substrate 300, an active area AA11 is formed, and an element isolation area STI11 having STI trenches is formed around the active area AA11. The STI trenches include a wide STI trench STI11 having a trench width exceeding, e.g., 100 nm, and a narrow STI trench STI11 having a trench width of 70 nm or less.

In the active area AA11, a gate electrode GE11 is formed via a gate insulating film GI11 on a channel area between source and drain areas. A dielectric interlayer 321 is formed on the entire surface. In desired areas of the semiconductor substrate 300, contact holes CH11 are formed in the dielectric interlayer 321. Metal interconnections MW11 on the dielectric interlayer 321 are connected to the contact holes CH11.

The STI element isolation structure according to this embodiment is the same as the hybrid STI element isolation structure using the coating film and HDP-SiO$_2$ film shown in FIGS. 51 to 55, except for the shape of the insulating film buried in the STI trenches.

The differences of the STI structure of this embodiment from the hybrid STI structure shown in FIGS. 51 to 55 are as follows.

1) In an STI trench having an STI width of 1 µm or more and in an STI trench having an STI width of 70 nm or less, a coating film is formed only in areas below the surface of a semiconductor substrate. This completely prevents the formation of recesses by wet etching when a mask SiN film or pad SiO$_2$ film is removed.

Accordingly, no acute corners are exposed to the upper side surfaces of the STI trenches, so no recess called a divot formed by abnormal recession of the buried insulating film exists.

2) A dielectric film is stably formed by coating on the bottoms of both wide and narrow STI trenches. Therefore, it is possible, by using a material such as a PSZ film having a small film stress as a dielectric film, to alleviate the film stress of the buried film in the STI trenches, reduce silicon crystal defects, and increase the yield of the products.

A method of fabricating this hybrid STI structure will be explained below.

FIGS. 30 to 35 illustrate the sections of elements according to this embodiment in order of steps.

In this embodiment, only the steps of forming the STI structure will be described. However, an LSI can be completed after that by forming a gate insulating film, gate electrodes, dielectric interlayers, contacts, and interconnections following the conventional LSI fabrication method.

Figure 30:
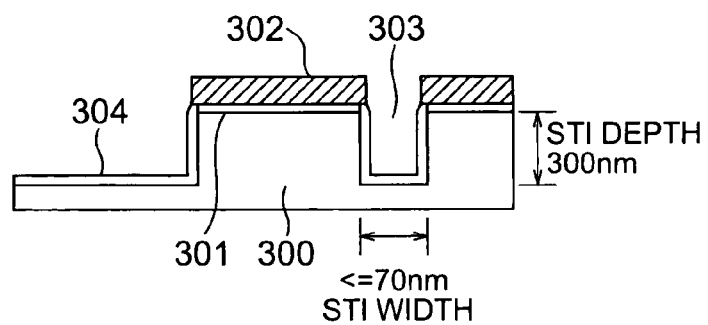
FIG. 30 is a sectional view showing the sectional structure of elements in one fabrication step according to the sixth embodiment of the present invention.

First, as shown in FIG. 30, an SiO$_2$ film 301 about, e.g., 4 nm thick is formed on the surface of a semiconductor substrate 300. On top of the SiO$_2$ film 301, an SiN film 302 about 150 nm thick is formed as a mask material by LP-CVD.

After that, the conventional exposure technique and the dry etching technique using RIE are performed to process the SiN film 302, SiO$_2$ film 301, and semiconductor substrate 300 in this order, thereby forming, in the semiconductor substrate 300, STI trenches 303 about, e.g., 300 nm deep as element isolation trenches for STI element isolation.

Since these STI trenches are trenches for element isolation, trenches having various widths are formed in the semiconductor substrate 300 as needed. In this embodiment, the STI trenches 303 have a large STI width of 1 μm or more and a small STI width of about 70 nm.

In this embodiment, the SiN film 302 is used as a mask material. However, it is also possible to stack an $SiO_2$ film on the SiN film 302 and use this $SiO_2$ film as an etching mask material for the semiconductor substrate 300.

Next, the surface of the semiconductor substrate 300 is oxidized by the conventional thermal oxidation method to form a thermal oxide film 304 about 4 nm thick on the side surfaces of the STI trenches.

Note that a high-quality silicon oxide film having a uniform film thickness regardless of the surface orientation of silicon (Si) may also be formed on the side surfaces of the STI trenches 303 by using oxygen radicals, instead of the conventional thermal oxidation method. Alternatively, the side surfaces of the SiN film 302 can be slightly oxidized by the ISSG method.

Figure 31:
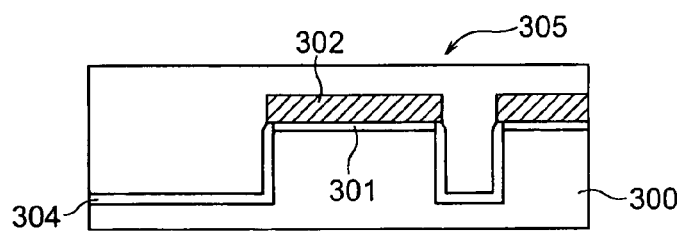
FIG. 31 is a sectional view showing the sectional structure of elements in one fabrication step according to the sixth embodiment of the present invention.

Subsequently, as shown in FIG. 31, a dielectric film is buried flat in the STI trenches. In this embodiment, the STP method will be described below as the method of burying the dielectric film.

For example, a dielectric film 305 made of, e.g., PSZ is formed on the mask SiN film 302 so as to have a film thickness of about 100 nm by using the STP method.

By using a coating apparatus for coating a base film, a baking step of volatilizing a solvent at about 150° C. is performed for about 3 min.

In this step, since the SiN film 302 is about 150 nm thick, the thickness from the surface of the PSZ film 305 to the bottom of each STI trench 303 is about 450 nm.

As described earlier, the burying characteristics of the STP method are so good that the dielectric film can be buried with a flatness of about ±10 nm over the entire surface without any voids in both a narrow STI trench having a trench width of about 70 nm and a wide STI trench. Then, the dielectric film 305 is converted into an $SiO_2$ film 305a.

Since the element formation area is covered with the SiN film 302, the surface of the semiconductor substrate 300 does not oxidize in this element formation area.

This chemical reaction proceeds from the surface of the dielectric film 305 exposed in the STI trenches 303. For example, when BOX oxidation is performed in a steam ambient at 300° C. or 400° C. for about 30 min, the dielectric film 305 about 600 nm thick formed on the semiconductor substrate 300 having a planar structure can be converted into an $SiO_2$ film.

Since the thickness of the dielectric film 305 from the surface to the bottoms of the STI trenches 303 is about 450 nm, the conversion from Si—N bonds to Si—O bonds is promoted when BOX oxidation is performed at 300° C. or 400° C. for about 30 min. As a consequence, the PSZ film 305 buried in the STI trenches 303 having different trench widths can be completely converted into the $SiO_2$ film 305 down to the bottoms of these trenches.

It is also possible to perform annealing for about 30 min in an oxidizing ambient or an inert gas ambient such as a nitrogen ambient at 700° C. to 1,000° C., preferably, in a nitrogen ambient at about 800° C., and release $NH_3$ and $H_2O$ remaining in the $SiO_2$ film 305 converted from the dielectric film 305, thereby densifying the $SiO_2$ film 305. The leakage current of the film can be reduced by this conversion into the $SiO_2$ film 305 having a high Si density.

In an oxygen ambient, the concentration of an impurity such as carbon (C) in the film can be further reduced. This makes it possible to reduce the leakage current and also reduce the fixed electric charge in the interface between the film and semiconductor substrate.

Also, when annealing is performed in an inert gas ambient such as a nitrogen gas ambient, oxidation of the silicon side surfaces of the STI trenches 303 can be prevented. Accordingly, a decrease in element width, i.e., an increase in STI width can be suppressed.

In this step, the element formation area is covered with the SiN film 302, so this portion does not oxidize even in an oxidizing ambient.

In the densify step, RTA or RTO may also be used instead of annealing in a common furnace.

When RTA is used, a high-temperature annealing step can be performed at a high temperature, e.g., 950° C. for a short time period of about 20 sec. Any of these annealing steps may also be performed after the following etch back step.

Figure 32:
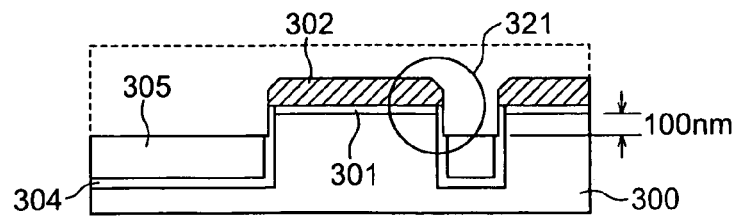
FIG. 32 is a sectional view showing the sectional structure of elements in one fabrication step according to the sixth embodiment of the present invention.

As shown in FIG. 32, to bury the PSZ dielectric film only on the bottoms of the STI trenches and remove the rest, the $SiO_2$ film 305 is etched back by, e.g., dry etching, wet etching, or a combination of non-masking CMP and wet etching.

When etch back is performed by dry etching, no large difference between the etching rates appears due to the variation in Si density of the dielectric film. Therefore, an $SiO_2$ film having a film thickness substantially corresponding to the uniformity of etch back can be formed on the bottoms of the STI trenches.

The PSZ dielectric film 305 is so formed that the height on the STI bottom is lower by about, e.g., 100 nm than the surface of the semiconductor substrate 300. This film thickness can be optimized by the film stress of the dielectric film to be buried or the burying characteristics of, e.g., an $HDP-SiO_2$ film to be formed later.

Also, anisotropic etching conditions are used in dry etch back. Therefore, as indicated by a circle 321 in FIG. 32, when the dielectric film 305 is etched by using the SiN film 302 as a mask, the $SiO_2$ film 304 partially remains on the silicon side walls by the eaves effect of the SiN film 302, thereby preventing etching of the silicon side surfaces.

Figure 33:
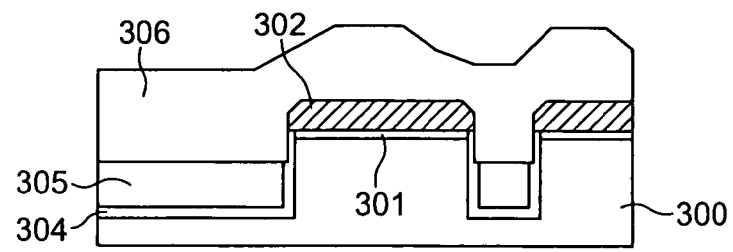
FIG. 33 is a sectional view showing the sectional structure of elements in one fabrication step according to the sixth embodiment of the present invention.

As shown in FIG. 33, an $HDP-SiO_2$ film 306 is deposited to fill the STI trenches 303 having decreased aspect ratios.

Since the depth of the STI trenches 303 is decreased from 300 nm to about 100 nm, the STI trenches 303 can be completely filled by depositing the $SiO_2$ film 306 on the entire surface by HDP-CVD.

After that, the $SiO_2$ film 306 can be densified by performing annealing in an $N_2$ ambient at, e.g., 850° C. for about 30 min.

Figure 34:
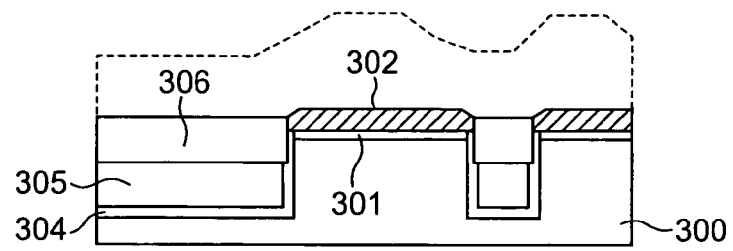
FIG. 34 is a sectional view showing the sectional structure of elements in one fabrication step according to the sixth embodiment of the present invention.

Next, as shown in FIG. 34, the $HDP-SiO_2$ film 306 is planarized by CMP with reference to the surface of the mask SiN film 302.

Figure 35:
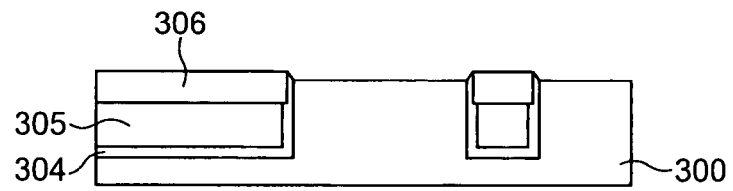
FIG. 35 is a sectional view showing the sectional structure of elements in one fabrication step according to the sixth embodiment of the present invention.

As shown in FIG. 35, the SiN film 302 and pad $SiO_2$ film 301 are removed to expose the surface of the semiconductor substrate 300.

Since the $SiO_2$ film 306 on the STI trenches is formed by annealing the $HDP-SiO_2$ film, the wet etching rate can be decreased to about 1.0 to 1.2 times that of a thermal oxide film.

This can also prevent excess etching of the $SiO_2$ film 306 on the STI trenches when the $SiO_2$ film 301 is removed.

In this way, the $SiO_2$ film 306 slightly expanding above the surface of the semiconductor substrate 300 and having a trapezoidal section is buried to realize an STI structure having a desired shape.

After that, although not shown, a MOS transistor is completed through, e.g., the formation of a sacrificial oxide film, channel ion injection, the removal of the sacrificial oxide film, the formation of a gate insulating film, the formation of gate electrodes, the formation of source/drain diffusion layers, the formation of dielectric interlayers, the formation of contacts, the formation of wiring layers, the formation of a passivation film, and the formation of pads.

In the sixth embodiment described above, the combination of the PSZ film and HDP-$SiO_2$ film makes it possible to form a high-aspect-ratio STI structure having a desired shape without any shape deterioration such as a recess.

In particular, a PSZ film having a desired film thickness can be uniformly formed over the entire surface regardless of whether the STI width is as large as 1 μm or more or as small as about 70 nm or less. Additionally, the upper portion of each STI trench can be completely filled with an HDP-$SiO_2$ film having a wet etching rate substantially equal to that of a thermal oxide film.

Accordingly, an element isolation structure having no shape deterioration in STI trenches can be formed regardless of the STI trench width.

Also, even in the semiconductor substrate surface oxidation step and oxide film removal step repeated in the semiconductor fabrication process after the STI formation, element isolation can be realized by maintaining the well-shaped STI structure. Furthermore, since the leakage current and the fixed electric charge on the bottom of each STI trench can be reduced, the yield of the products can be increased.

Seventh Embodiment

The STI structure of a semiconductor device and a method of fabricating the structure according to the seventh embodiment of the present invention will be described below.

Figure 36:
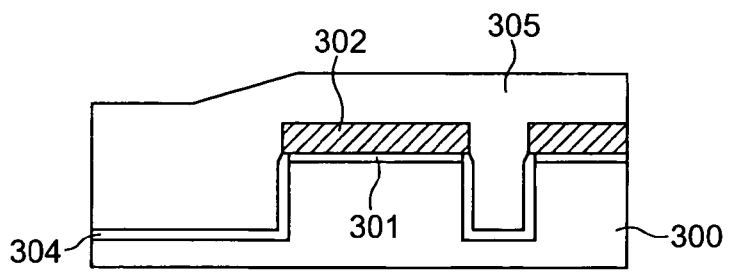
FIG. 36 is a sectional view showing the sectional structure of elements in one fabrication step according to the seventh embodiment of the present invention.
Figure 37:
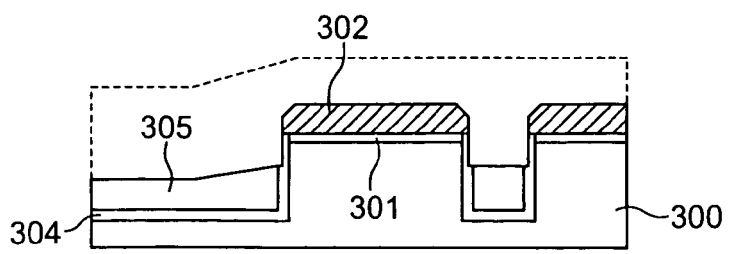
FIG. 37 is a sectional view showing the sectional structure of elements in one fabrication step according to the seventh embodiment of the present invention.

FIGS. 36 and 37 illustrate the formation of the STI structure according to the seventh embodiment in order of steps.

The steps of this embodiment are the same as the above sixth embodiment except for the process of forming a dielectric film. Therefore, only the steps different from the sixth embodiment will be explained below.

In this embodiment, as shown in FIG. 36, a dielectric film 305 made of PSZ is formed by common spin coating without using the STP method. The entire surface can be evenly coated by adjusting the molecular weight and viscosity of the dielectric film, or by adjusting the rotational speed of spin coating. After that, annealing is performed at a temperature of about 400° C. in an oxygen ambient for about 30 min. In this stage, the dielectric film 305 is not completely converted into an $SiO_2$ film.

Subsequently, as shown in FIG. 37, to leave the PSZ dielectric film on the bottoms of STI trenches and remove the rest, the $SiO_2$ film 305 is etched back and left behind on the bottoms of the STI trenches by, e.g., dry etching, wet etching, or a combination of non-masking CMP and wet etching.

When etch back is performed by dry etching, no large difference between the etching rates appears due to the variation in Si density of the dielectric film 305. Therefore, a film having a film thickness substantially corresponding to the uniformity of etch back can be formed on the bottoms of the STI trenches.

The PSZ dielectric film 305 is so formed that the height on the STI bottom is lower by about, e.g., 100 nm than the surface of the semiconductor substrate 300.

This film thickness can be optimized by the film stress of the dielectric film 305 to be buried or the burying characteristics of, e.g., an HDP-$SiO_2$ film to be formed on the surface of the dielectric film 305.

After that, BOX oxidation is performed at about 400° C., and annealing is performed in an oxidizing ambient or an inert gas ambient such as a nitrogen ambient at a temperature of 700° C. to 1,000° C., e.g., about 800° C. for about 30 min, thereby converting the PSZ dielectric film 305 into an $SiO_2$ film 305. This annealing densifies the $SiO_2$ film 305 by releasing $NH_3$ or $H_2O$ remaining in the film, thereby converting the film into the $SiO_2$ film 305 having a high Si density. As a consequence, the leakage current of the film can be reduced.

Also, in an oxygen ambient, the concentration of an impurity such as carbon (C) in the film can be further reduced. This makes it possible to reduce the leakage current and also reduce the fixed electric charge in the interface between the film and semiconductor substrate. Since the $SiO_2$ film 305 is made thin, the efficiency of this annealing is high.

In this embodiment, as in the sixth embodiment described above, an STI element isolation structure well buried in STI trenches can be implemented by the hybrid structure of a PSZ dielectric film and HDP-$SiO_2$ film.

Eighth Embodiment

The STI structure of a semiconductor device and a method of fabricating this structure according to the eighth embodiment of the present invention will be described below.

FIG. 38 to 43 illustrate the formation of the STI structure according to the eighth embodiment in order of steps.

The steps of this embodiment are the same as the sixth and seventh embodiments except that before a dielectric film made of PSZ is formed, another insulating film is formed. Accordingly, only the steps different from the seventh embodiment will be explained below.

This embodiment uses the pullback method by which an SiN film 302 as a mask material is selectively pulled back by about 10 nm in the lateral direction. However, whether to use this pullback method can be selected in accordance with the required performance of the semiconductor device.

In the pullback step, hot phosphoric acid or the like is generally used. In this step, it is desirable to use isotropic etching by which the selective ratio of an $SiO_2$ film 301 to the SiN film 302 is 2 or more.

Figure 38:
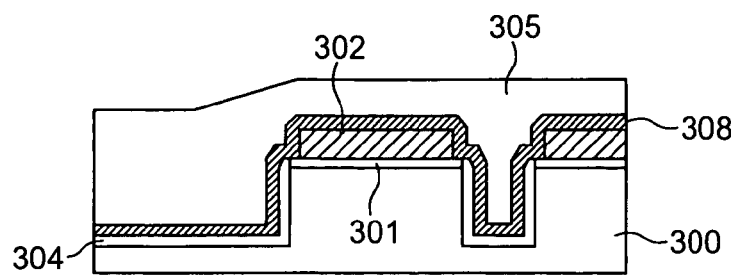
FIG. 38 is a sectional view showing the sectional structure of elements in one fabrication step according to the eighth embodiment of the present invention.

As shown in FIG. 38, a high-coverage insulating film 141 having a film thickness so adjusted as not to completely fill STI trenches is formed on the entire surface. In this embodiment, a TEOS-$SiO_2$ film 308 is formed by LP-CVD.

The film thickness is set at about 20 nm so as not to completely fill an STI trench having a width of, e.g., 70 nm.

Then, a PSZ film or the like is formed as a coating type dielectric film 305 on the entire surface. In this embodiment, the dielectric film 305 is formed by common spin coating without using the STP. However, the dielectric film 305 may also be formed by the STP method.

The entire surface can be evenly coated by adjusting the molecular weight or viscosity of the dielectric film 305, or by adjusting the rotational speed of spin coating.

After that, annealing is performed at a temperature of about 400° C. in an oxygen ambient for about 30 min. In this stage, the PSZ dielectric film 305 is not completely converted into an $SiO_2$ film 305.

Figure 39:
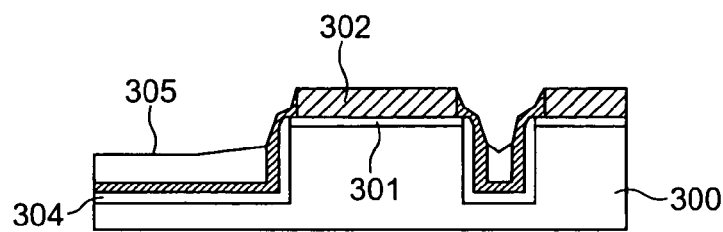
FIG. 39 is a sectional view showing the sectional structure of elements in one fabrication step according to the eighth embodiment of the present invention.
Figure 40:
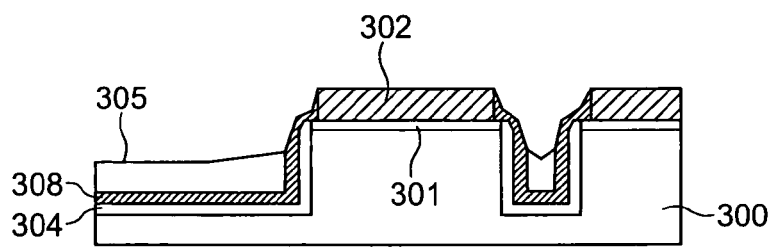
FIG. 40 is a sectional view showing the sectional structure of elements in one fabrication step according to the eighth embodiment of the present invention.

Subsequently, as shown in FIG. 39, to leave the dielectric film 305 on the bottoms of STI trenches and remove the rest, the dielectric film 305 is etched back by wet etching using, e.g., BHF.

When etch back is performed by wet etching, the etching rates of the TEOS-$SiO_2$ film 308 and the PSZ film 305 are different. Accordingly, the PSZ film 305 can be left behind on the bottoms of the STI trenches without largely etching the TEOS-$SiO_2$ film 308.

The PSZ dielectric film 305 is so formed that the height on the STI bottom is lower by about, e.g., 100 nm than the surface of a semiconductor substrate 300.

After that, BOX oxidation is performed at about 400° C., and annealing is performed in an oxidizing ambient or an inert gas ambient such as a nitrogen ambient at a temperature of 700° C. to 1,000° C., e.g., about 800° C. for about 30 min, thereby converting the PSZ dielectric film 305 into an $SiO_2$ film 305.

This annealing densifies the $SiO_2$ film 305 by releasing $NH_3$ or $H_2O$ remaining in the film, thereby converting the film into the $SiO_2$ film 305 having a high Si density. As a consequence, the leakage current of the film can be reduced.

Also, in an oxygen ambient, the concentration of an impurity such as carbon (C) in the film can be further reduced. This makes it possible to reduce the leakage current and also reduce the fixed electric charge in the interface between the film and semiconductor substrate. Since the $SiO_2$ film 305 is made thin, the efficiency of this annealing is high.

Figure 41:
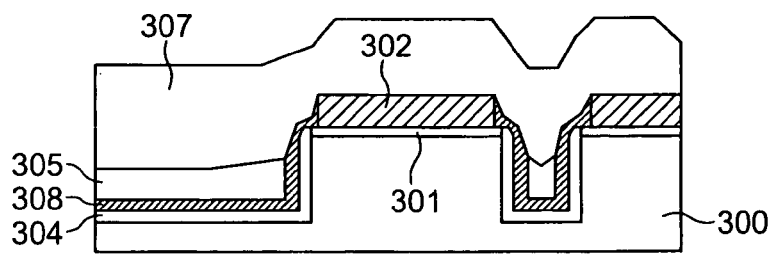
FIG. 41 is a sectional view showing the sectional structure of elements in one fabrication step according to the eighth embodiment of the present invention.
Figure 42:
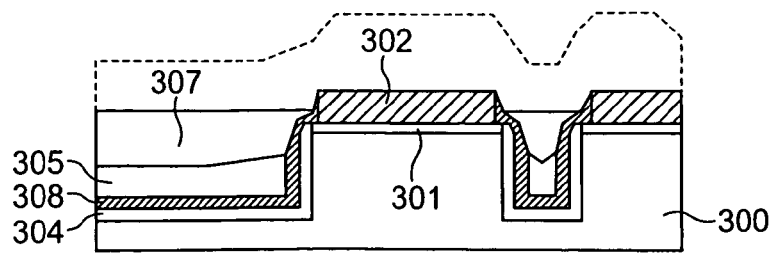
FIG. 42 is a sectional view showing the sectional structure of elements in one fabrication step according to the eighth embodiment of the present invention.
Figure 43:
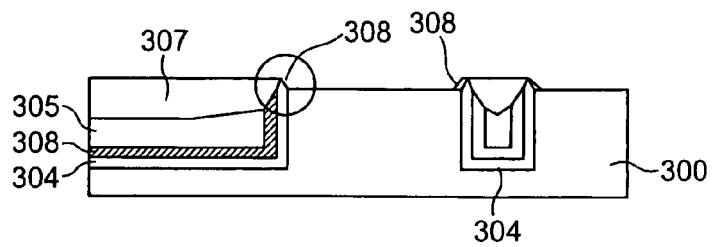
FIG. 43 is a sectional view showing the sectional structure of elements in one fabrication step according to the eighth embodiment of the present invention.

Subsequent steps shown in FIGS. 41 to 43 are basically the same as the sixth embodiment. Referring to FIG. 41, an HDP-$SiO_2$ film 307 is deposited to fill the STI trenches having decreased aspect ratios.

After that, as shown in FIG. 42, planarization is performed by CMP to such an extent that the surface of the SiN film 302 is exposed.

As shown in FIG. 43, the SiN film 302 as a mask material and the pad $SiO_2$ film 301 are removed by wet etching.

In the eighth embodiment as described above, an STI structure having a good shape can be realized by using the hybrid structure of the TEOS-$SiO_2$ film 304, PSZ dielectric film 305, and HDP-$SiO_2$ film 307.

Also, in the eighth embodiment, the pullback step for the $SiO_2$ film 302 as a mask and the recess step using wet etching for the TEOS-$SiO_2$ film 307 are explained.

In this case, as indicated by a circle 308 in FIG. 43, the TEOS-$SiO_2$ film 307 partially remains on the side surfaces of the SiN film 302, and, when the pad $SiO_2$ film 301 is removed in the subsequent step, the $SiO_2$ film 307 extends toward the semiconductor substrate 300. Therefore, the exposure of the corners of the semiconductor substrate can be prevented more stably than in the sixth and seventh embodiments.

Ninth Embodiment

The STI structure of a semiconductor device and a method of fabricating this structure according to the ninth embodiment of the present invention will be described below.

This embodiment is suited to a hybrid STI element isolation structure which covers a PSZ dielectric film in STI trenches by using a TEOS-$SiO_2$ film and HDP-$SiO_2$ film in a semiconductor device, particularly, a NAND flash device, CMOS logic device, or the like.

Figure 44:
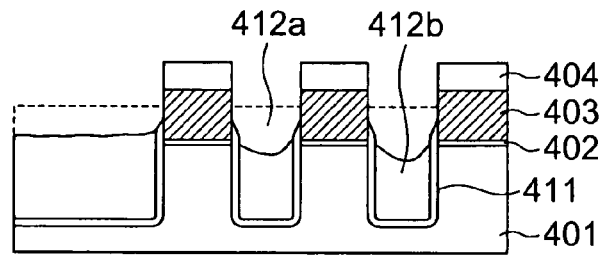
FIG. 44 is a sectional view showing the sectional structure of elements in one fabrication step according to the ninth embodiment of the present invention.
Figure 45:
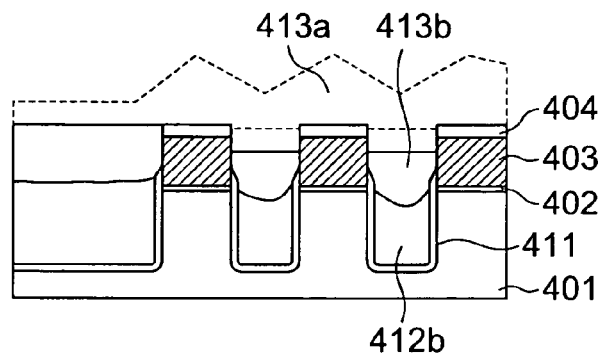
FIG. 45 is a sectional view showing the sectional structure of elements in one fabrication step according to the ninth embodiment of the present invention.
Figure 46:
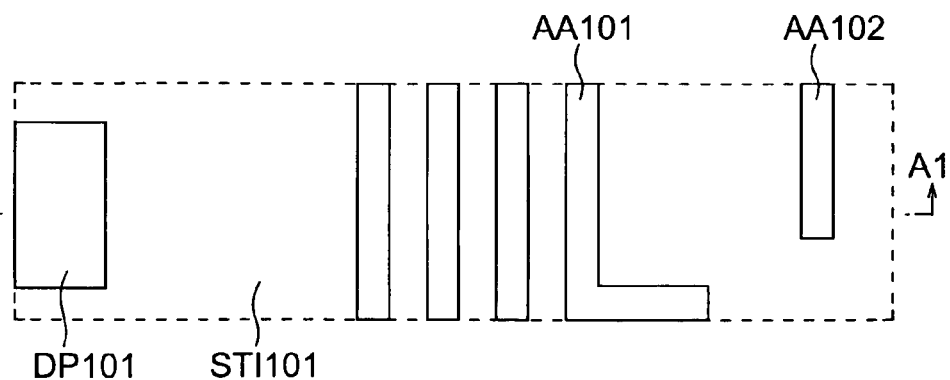
FIG. 46 is a plan view showing the two-dimensional arrangement of a semiconductor device having STI trenches different in trench width.
Figure 47:
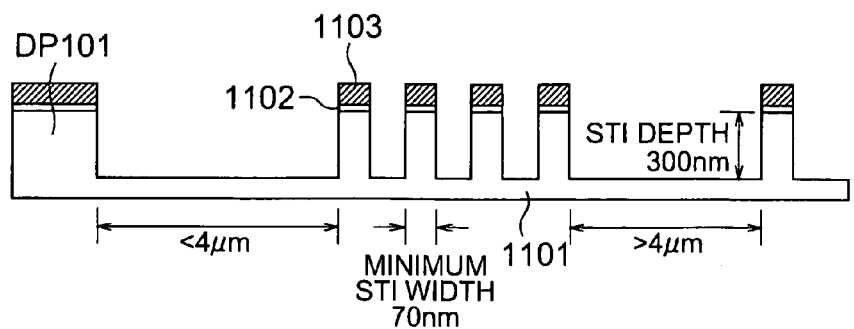
FIG. 47 is a longitudinal sectional view, taken along a line A1—A1 in FIG. 46, showing the longitudinal section of elements according to the conventional semiconductor device in one fabrication step.
Figure 48:
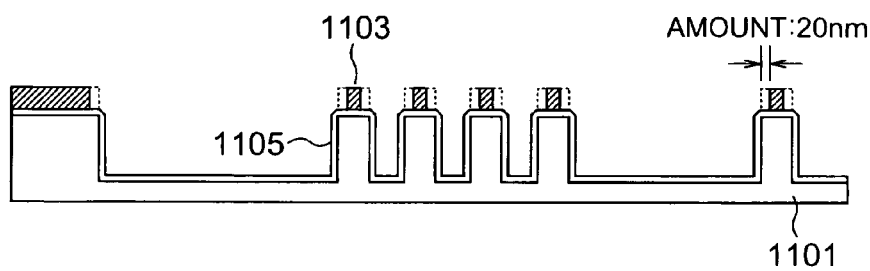
FIG. 48 is a longitudinal sectional view showing the longitudinal section of the elements according to the semiconductor device in another fabrication step.
Figure 49:
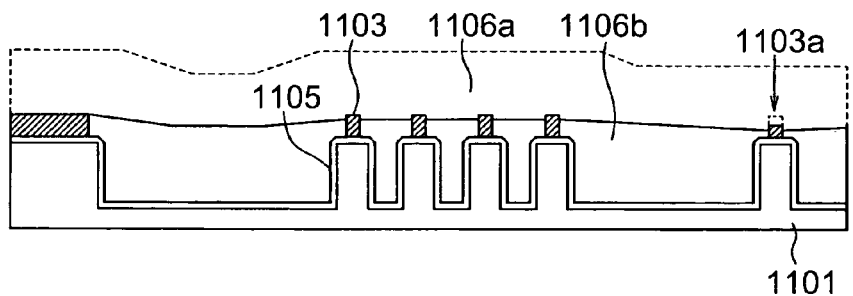
FIG. 49 is a longitudinal sectional view showing the longitudinal section of the elements according to the semiconductor device in another fabrication step.
Figure 50:
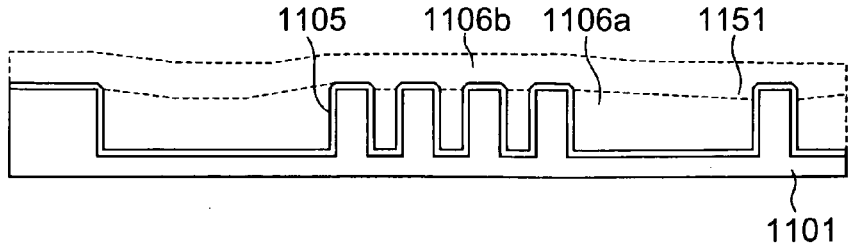
FIG. 50 is a longitudinal sectional view showing the longitudinal section of the elements according to the semiconductor device in another fabrication step.
Figure 51:
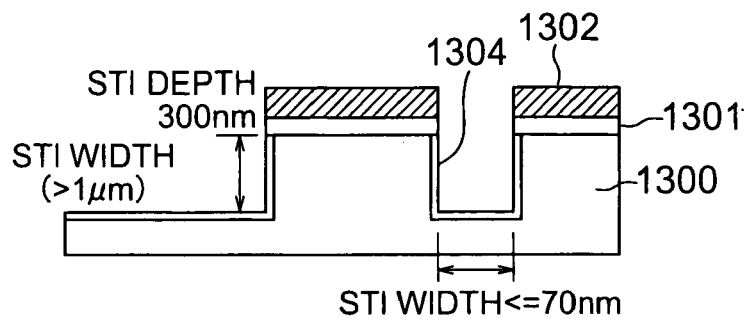
FIG. 51 is a longitudinal sectional view showing the longitudinal section of the elements according to anther conventional semiconductor device in one fabrication step.
Figure 52:
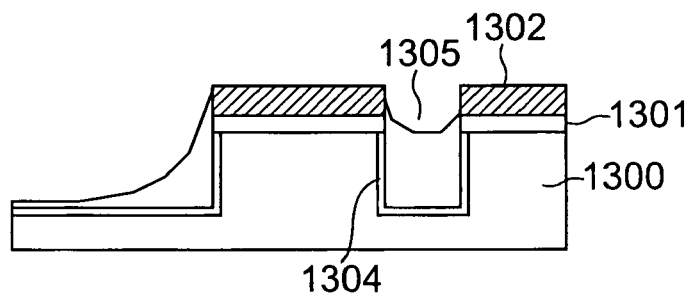
FIG. 52 is a longitudinal sectional view showing the longitudinal section of the elements according to the semiconductor device in another fabrication step.
Figure 53:
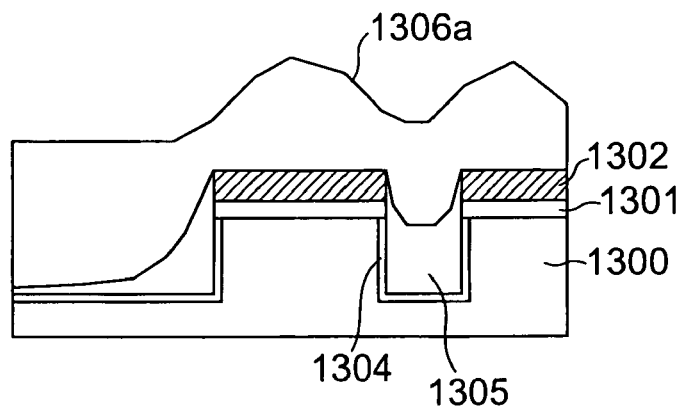
FIG. 53 is a longitudinal sectional view showing the longitudinal section of the elements according to the semiconductor device in another fabrication step.
Figure 54:
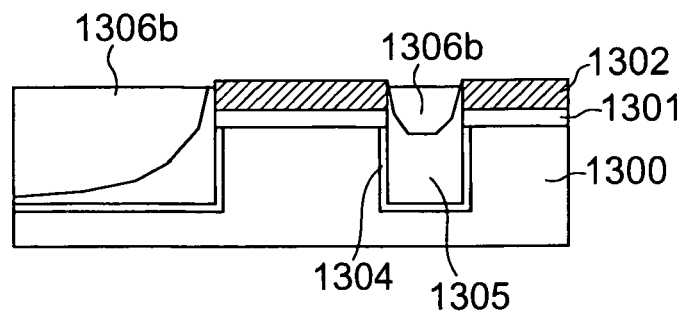
FIG. 54 is a longitudinal sectional view showing the longitudinal section of the elements according to the semiconductor device in another fabrication step.
Figure 55:
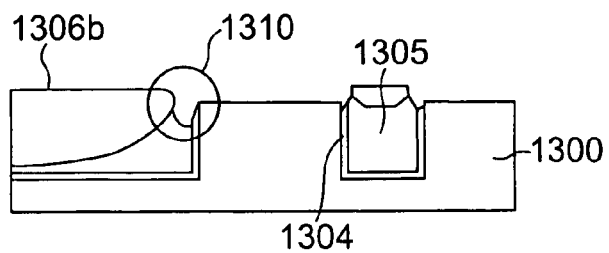
FIG. 55 is a longitudinal sectional view showing the longitudinal section of the elements according to the semiconductor device in another fabrication step.
Figure 56:
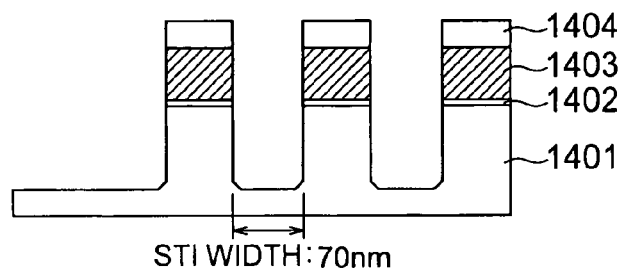
FIG. 56 is a longitudinal sectional view showing the longitudinal section of the elements according to anther conventional semiconductor device in one fabrication step.
Figure 57:
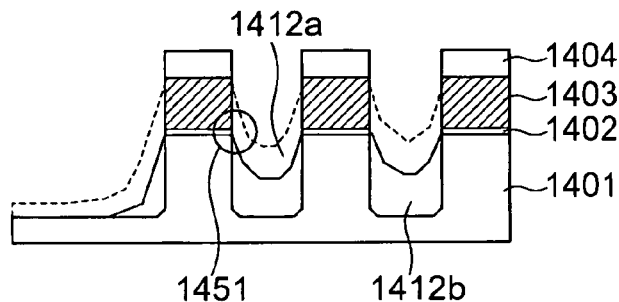
FIG. 57 is a longitudinal sectional view showing the longitudinal section of the elements according to the semiconductor device in another fabrication step.
Figure 58:
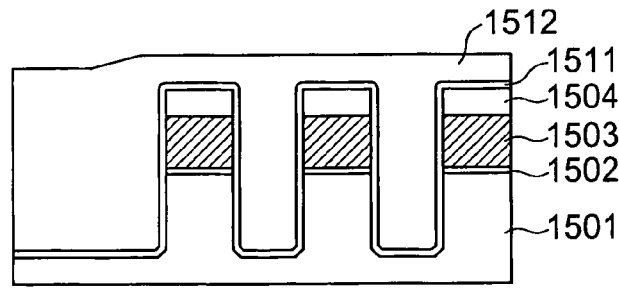
FIG. 58 is a longitudinal sectional view showing the longitudinal section of the elements according to anther conventional semiconductor device in one fabrication step.
Figure 59:
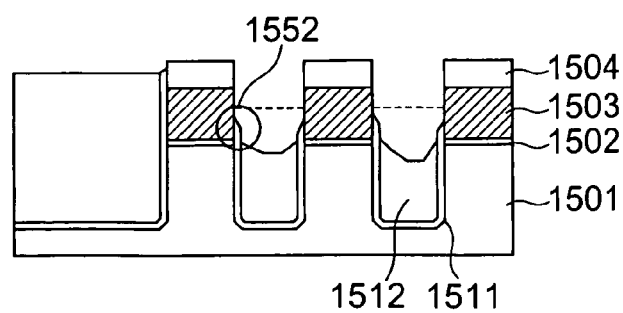
FIG. 59 is a longitudinal sectional view showing the longitudinal section of the elements according to the semiconductor device in another fabrication step.

FIGS. 44 and 45 illustrate the sections of elements in different steps according to this embodiment.

As shown in FIG. 44, an $SiO_2$ film 402, a conductive film 403 made of a conductive material for forming a floating gate, and an SiN film 404 as a mask material are formed on the surface of a semiconductor substrate 401.

After that, the SiN film 404, conductive film 403, $SiO_2$ film 402, and semiconductor substrate 401 are processed in this order by the conventional exposure technique and the dry etching technique using RIE, thereby forming, in the semiconductor substrate 401, STI trenches about, e.g., 300 nm deep for STI element isolation.

In this embodiment, the SiN film 404 is used as a mask material. However, it is also possible to stack an $SiO_2$ film on the SiN film 404 and use this $SiO_2$ film as an etching mask material of the semiconductor substrate 401.

Next, as a high-coverage insulating film having a film thickness so adjusted as not to completely fill the STI trenches, a TEOS-$SiO_2$ film 411 is formed in the STI trenches by, e.g., LP-CVD.

The film thickness is set at about 20 nm so as not to completely fill an STI trench having a width of, e.g., 70 nm.

Then, a PSZ film or the like is formed as a coating type dielectric film 412a on the entire surface. In this embodiment, the dielectric film 412a is formed by common spin coating without using the STP method. However, the dielectric film 305 may also be formed by the STP method.

The entire surface can be evenly coated by adjusting the molecular weight or viscosity of the dielectric film 412a, or by adjusting the rotational speed of spin coating.

After that, annealing is performed at a temperature of about 400° C. in an oxygen ambient for about 30 min, thereby converting the PSZ dielectric film 412a into an $SiO_2$ film. In this stage, however, the PSZ dielectric film 412a is not completely converted into an $SiO_2$ film.

After the entire surface is planarized by CMP, to leave a dielectric film 412b on the bottoms of the STI trenches and remove the rest, the dielectric film 412a is etched back by dry etching and then by wet etching as post-processing.

After that, BOX oxidation is performed at about 400° C., and annealing is performed in an oxidizing ambient or an inert gas ambient such as a nitrogen ambient at a temperature of 700° C. to 1,000° C., e.g., about 800° C. for about 30 min, thereby converting the PSZ dielectric film 412a into an $SiO_2$ film 412b. This annealing densifies the $SiO_2$ film 412b by releasing $NH_3$ or $H_2O$ remaining in the film, thereby reducing the leakage current of the film.

Also, in an oxygen ambient, the concentration of an impurity such as carbon (C) in the film can be further reduced. This makes it possible to reduce the leakage current and also reduce the fixed electric charge in the interface between the film and semiconductor substrate. Since the $SiO_2$ film 412b is made thin, the efficiency of this annealing is high.

Subsequently, an HDP-$SiO_2$ film 413a is deposited to fill the STI trenches having decreased aspect ratios. Planarization is performed by CMP to such an extent that the surface of the SiN film 404 is exposed.

Steps after that are the same as in the sixth to eighth embodiments. That is, a MOSFET is completed through, e.g., the formation of gate electrodes, source/drain diffusion layers, dielectric interlayers, contacts, wiring layers, a passivation film, and pads.

In the ninth embodiment as described above, a well-shaped STI structure can be realized by using the hybrid structure in which the SiO$_2$ film 412b converted from PSZ is surrounded by the TEOS-SiO$_2$ film 411 and HDP-SiO$_2$ film 413b in the STI trenches.

Especially in a NAND flash memory, logic device, or the like, damage to a tunnel insulating film can be prevented by burying a PSZ dielectric film in the lower portions of STI trenches via a TEOS-SiO$_2$ film. Accordingly, the reliability of the memory, logic device, or the like can be improved.

Also, the HDP-SiO$_2$ film is buried in the upper portion of each STI trench while the aspect ratio of the STI trench is decreased by the TEOS-SiO$_2$ film and PSZ dielectric film buried in the lower portion of the STI trench. As a consequence good burying characteristics can be obtained.

Furthermore, when the STI element isolation structure as described above is used, even if multi-oxide films are present on the side surfaces of a floating gate conductive film in a flash memory or in a CMOS logic device, wet etching of the HDP-SiO$_2$ film can be well controlled in the wet etching step without giving any damage to these films.

In addition, in the STI trench, the TEOS-SiO$_2$ film 411 and HDP-SiO$_2$ film 413b are so formed as to surround the dielectric film 412b, i.e., the dielectric film 412b having a lower Si density than that of the films 411 and 413b is present. Accordingly, the film stress of the whole STI insulating film can be reduced. This makes it possible to prevent pattern distortion and crystal defects caused by the film stress, and increase the yield of the products.

In the semiconductor devices and their fabrication methods of the above embodiments, good burying characteristics can be obtained regardless of the aspect ratio by planarizing the surface of a semiconductor device having steps by burying a dielectric film.

Any of the above embodiments does not limit the present invention, and can be variously modified and practiced without departing from the technical scope of the invention.

What is claimed is:

1. A semiconductor device fabrication method comprising:
    forming a first insulating film by chemical vapor deposition, on a surface of a semiconductor substrate having a trench in a surface portion, thereby covering inner walls of the trench with the first insulating film;
    selectively forming a second insulating film by spin coating, on the first insulating film in the trench;
    etching back the second insulating film by wet etching to leave a first portion of the second insulating film over a bottom of the trench and to remove a remaining portion of the second insulating film; and
    selectively forming a third insulating film by chemical vapor deposition, on the first and second insulating films in the trench.

2. A method according to claim 1, further comprising:
    annealing the semiconductor substrate in a water-containing ambient at a temperature of 200° C. to 600° C. for a predetermined time, after the second insulating film is formed; and
    holding the semiconductor substrate at a temperature of 450° C. to 1,000° C. for a predetermined time.

3. A method according to claim 1, wherein, when the second insulating film is etched back by the wet etching, the etching rate of the first insulating film is lower than that of the second insulating film, thereby allowing a portion of the first insulating film to remain over the bottom of the trench.

4. A method according to claim 3, wherein, after the second insulating film is etched back by the wet etching, forming tops of the first and second insulating films into a forward tapered shape.

5. A method according to claim 1, wherein, after the second insulating film is formed and before the second insulating film is etched back by the wet etching, annealing in an oxidizing ambient such that at least a portion of the second insulating film is not converted into an SiO$_2$ film.

6. A method according to claim 5, wherein the oxidizing ambient is an oxygen ambient or a steam ambient.

7. A method according to claim 1, wherein etching back the second insulating film comprises etching back the second insulating film such that a height of the second insulating film is lower than a top surface of the semiconductor substrate.

8. A method according to claim 1, wherein etching back the second insulating film comprises etching back the first insulating film to bury the first and second insulating films in the trench to a height lower than a top surface of the semiconductor substrate.

* * * * *